United States Patent
Komiyama

(10) Patent No.: US 10,921,382 B2
(45) Date of Patent: Feb. 16, 2021

(54) BATTERY INFORMATION PROCESSING APPARATUS, BATTERY MANUFACTURING SUPPORT APPARATUS, BATTERY ASSEMBLY, BATTERY INFORMATION PROCESSING METHOD, AND METHOD OF MANUFACTURING BATTERY ASSEMBLY

(71) Applicant: Toyota Jidosha Kabushiki Kaisha, Toyota (JP)

(72) Inventor: Keita Komiyama, Toyota (JP)

(73) Assignee: Toyota Jidosha Kabushiki Kaisha, Toyota (JP)

( * ) Notice: Subject to any disclaimer, the term of this patent is extended or adjusted under 35 U.S.C. 154(b) by 57 days.

(21) Appl. No.: 16/225,940

(22) Filed: Dec. 19, 2018

(65) Prior Publication Data

US 2019/0195961 A1    Jun. 27, 2019

(30) Foreign Application Priority Data

Dec. 25, 2017 (JP) .............................. JP2017-247723

(51) Int. Cl.
*G01R 31/392* (2019.01)
*H01M 10/48* (2006.01)
*G01R 31/389* (2019.01)
*H01M 10/42* (2006.01)

(52) U.S. Cl.
CPC ......... *G01R 31/392* (2019.01); *G01R 31/389* (2019.01); *H01M 10/425* (2013.01); *H01M 10/482* (2013.01); *H01M 2010/4271* (2013.01); *H01M 2010/4278* (2013.01); *H01M 2220/20* (2013.01)

(58) Field of Classification Search
None
See application file for complete search history.

(56) References Cited

U.S. PATENT DOCUMENTS

| | | | |
|---|---|---|---|
| 2010/0285349 A1* | 11/2010 | Goto ................... | H01M 10/484 429/156 |
| 2013/0200902 A1* | 8/2013 | Kurimoto ............... | B60L 58/21 324/430 |
| 2015/0153424 A1* | 6/2015 | Kanada ................. | H01M 10/42 324/430 |

FOREIGN PATENT DOCUMENTS

JP    2015-073427 A    4/2015

* cited by examiner

*Primary Examiner* — Haroon S. Sheikh
*Assistant Examiner* — Alex Rae
(74) *Attorney, Agent, or Firm* — Dinsmore & Shohl LLP

(57) ABSTRACT

A management server obtains information on a use history of a battery assembly used in a vehicle. The management server calculates an amount of material deterioration Dm and an amount of high-rate deterioration Dh by using the information on the use history of the battery assembly. When a ratio Dm/Dh is higher than a threshold value Th, the management server generates first assembly information indicating selection of a cell highly resistant against material deterioration and a spacer highly resistant against material deterioration (a cell A and a spacer A). When the ratio Dm/Dh is lower than the threshold value Th, the management server generates second assembly information indicating selection of a cell highly resistant against high-rate deterioration and a spacer highly resistant against high-rate deterioration (a cell B and a spacer B).

11 Claims, 17 Drawing Sheets

FIG.13

|  | NEGATIVE ELECTRODE ||  RESISTANCE AGAINST DETERIORATION |
| --- | --- | --- | --- |
|  | BET SPECIFIC SURFACE AREA | WEIGHT PER UNIT AREA |  |
| CELL A | SMALL | LIGHT | HIGH IN RESISTANCE AGAINST MATERIAL DETERIORATION |
| CELL B | LARGE | HEAVY | HIGH IN RESISTANCE AGAINST HIGH-RATE DETERIORATION |

FIG.14

|  | AREA OF CONTACT WITH BATTERY CASE | RESISTANCE AGAINST DETERIORATION |
| --- | --- | --- |
| SPACER A | LARGE | HIGH IN RESISTANCE AGAINST MATERIAL DETERIORATION |
| SPACER B | SMALL | HIGH IN RESISTANCE AGAINST HIGH-RATE DETERIORATION |

FIG.19

|  |  | EXAMPLE | COMPARATIVE EXAMPLE |
|---|---|---|---|
| USE HISTORY | Dm/Dh | \multicolumn{2}{c}{LESS THAN 1 (Dh>Dm)} |
| AT THE TIME OF MANUFACTURING | CELL TO BE USED | CELL B | RANDOM |
|  | SPACER TO BE USED | SPACER B | SPACER A |
| AFTER MANUFACTURING | RATE OF INCREASE IN RESISTANCE AFTER TRAVELING | 106.4% | 123.5% |
|  | OUTPUT AFTER LONG-TERM USE | 469W | 404W |

FIG.20

|  | WEIGHT PER UNIT AREA OF NEGATIVE ELECTRODE | RESISTANCE AGAINST DETERIORATION |
|---|---|---|
| CELL A | SMALL | HIGH IN RESISTANCE AGAINST MATERIAL DETERIORATION |
| CELL B | LARGE | HIGH IN RESISTANCE AGAINST HIGH-RATE DETERIORATION |

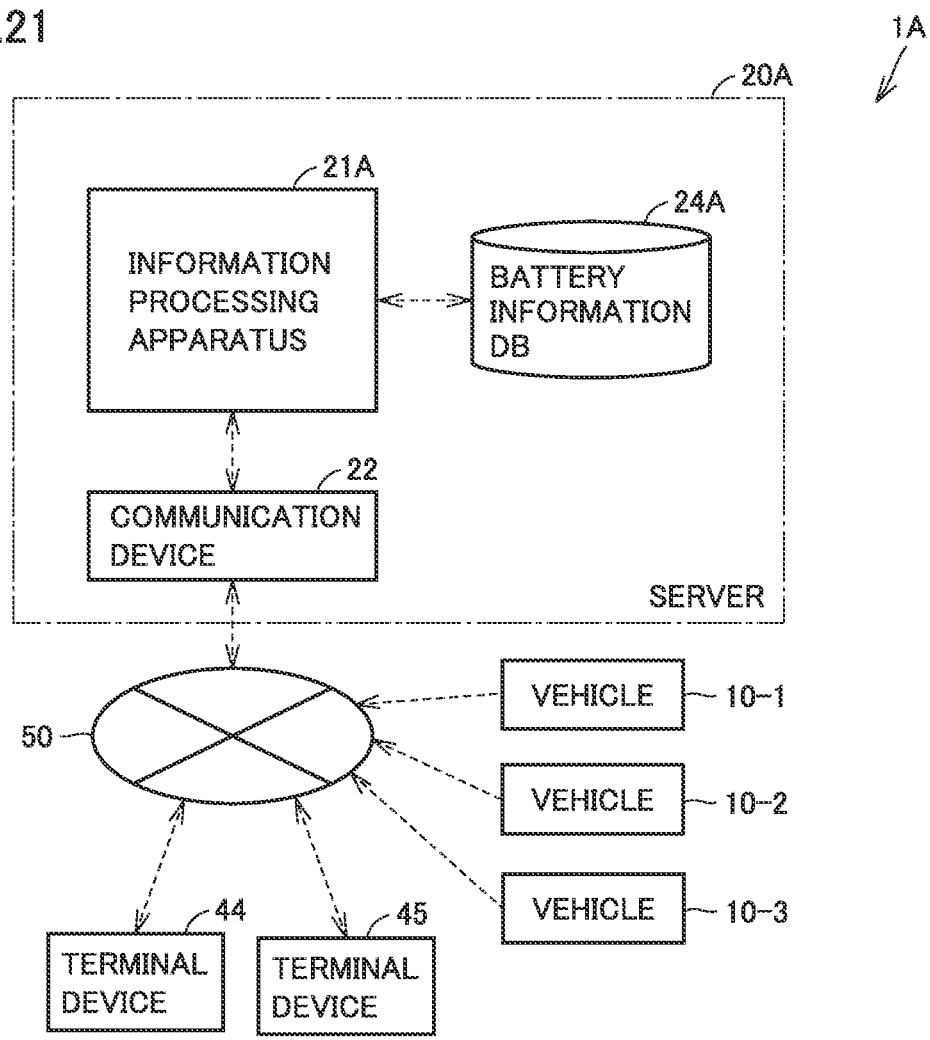

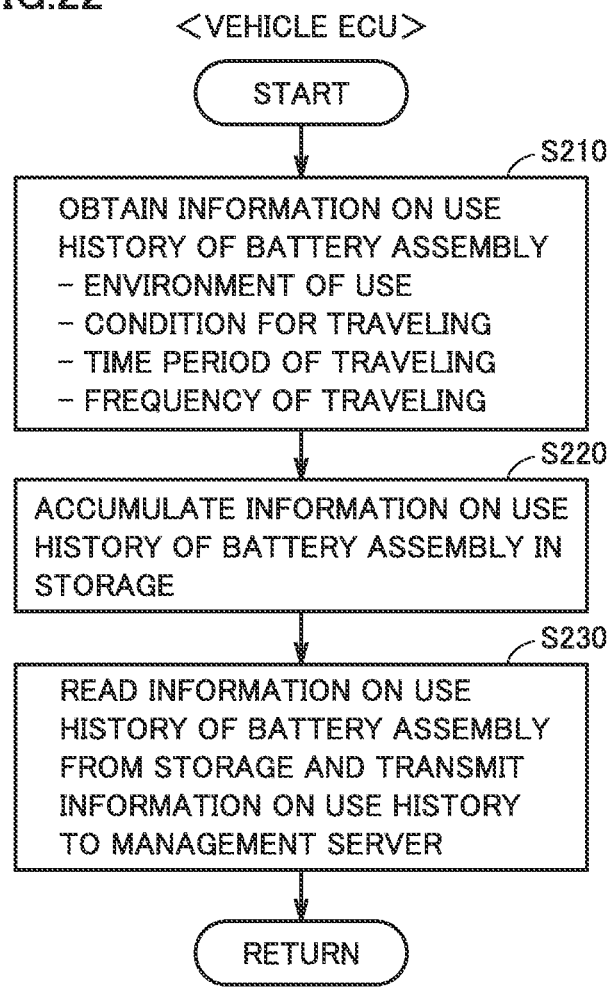

BATTERY INFORMATION PROCESSING APPARATUS, BATTERY MANUFACTURING SUPPORT APPARATUS, BATTERY ASSEMBLY, BATTERY INFORMATION PROCESSING METHOD, AND METHOD OF MANUFACTURING BATTERY ASSEMBLY

CROSS REFERENCE TO RELATED APPLICATIONS

This nonprovisional application claims priority to Japanese Patent Application 2017-247723 filed with the Japan Patent Office on Dec. 25, 2017, the entire contents of which are hereby incorporated by reference.

BACKGROUND

Field

The present disclosure relates to a battery information processing apparatus, a battery manufacturing support apparatus, a battery assembly, a battery information processing method, and a method of manufacturing a battery assembly, and particularly to a technique for manufacturing a battery assembly constructed by alternately stacking a plurality of cells and a plurality of spacers.

Description of the Background Art

A battery assembly is constituted of a plurality of secondary batteries. A battery assembly of a high capacity is obtained by combining a plurality of secondary batteries. In order to use a battery assembly for a long period of time, however, maintenance of the battery assembly is required. Japanese Patent Laying-Open No. 2015-73427 discloses a battery management system relating to maintenance of a battery assembly. The battery management system determines whether or not maintenance of a battery assembly is necessary based on variation in characteristics of a plurality of battery blocks included in the battery assembly, and when maintenance of the battery assembly is necessary, the battery management system gives information on a battery assembly to an interested party. Each secondary battery constituting the battery assembly is also referred to as a "cell" below.

SUMMARY

High-rate deterioration has generally been known as deterioration of a battery assembly. High-rate deterioration refers to increase in internal resistance of a cell due to an uneven ion concentration distribution in an electrolyte as a result of continued charging and discharging at a high current (a high rate). Increase in internal resistance accelerates deterioration of a cell. With deterioration of a cell, output and a capacity of the cell (an amount of electric power that can be stored in a cell) lowers. In general, in manufacturing a battery assembly, a cell and a spacer high in resistance against high-rate deterioration are often selected. Deterioration of a battery assembly, however, is not limited to high-rate deterioration, and deterioration of the battery assembly may also be accelerated by another factor. Therefore, it is not necessarily appropriate to use a cell and a spacer high in resistance against high-rate deterioration.

For which factor a battery assembly used as being mounted on a vehicle deteriorates varies depending on how the vehicle is used. Usage of a vehicle is different among users. Therefore, in manufacturing a battery assembly, appropriate cell and spacer are desirably selected in consideration of a difference in usage of a vehicle for each user. Though the battery management system described in Japanese Patent Laying-Open No. 2015-73427 is useful in that maintenance of a battery assembly can be done at appropriate timing, it fails in take into consideration a difference in usage of a vehicle for each user, and there is a further room for improvement for allowing selection of a cell and a spacer suitable for manufacturing a battery assembly.

The present disclosure was made to solve such a problem, and an object of the present disclosure is to provide a battery information processing apparatus and a battery information processing method capable of providing information for allowing selection of appropriate cell and spacer in consideration of a difference in usage of a vehicle for each user.

Another object of the present disclosure is to provide a battery manufacturing support apparatus which allows selection of an appropriate replacement cell in consideration of a difference in usage of a vehicle for each user.

Another object of the present disclosure is to provide a battery assembly manufactured by selecting an appropriate replacement cell in consideration of a difference in usage of a vehicle for each user and a method of manufacturing the same.

A battery information processing apparatus according to the present disclosure is a battery information processing apparatus which processes information for manufacturing a battery assembly constructed by alternately stacking a plurality of cells and a plurality of spacers, and the battery information processing apparatus includes a battery information obtaining device and an assembly information generator. The battery information obtaining device is configured to obtain information on a use history of the battery assembly used in a vehicle. The assembly information generator is configured to generate assembly information for selecting a cell and a spacer to be used for manufacturing the battery assembly. Specifically, the assembly information generator is configured to generate any one of first assembly information and second assembly information by using the information on the use history of the battery assembly. The first assembly information indicates selection of a cell and a spacer determined as being higher in resistance against deterioration of a material for the cell than resistance against high-rate deterioration of the cell based on a prescribed indicator. The second assembly information indicates selection of a cell and a spacer determined as being higher in resistance against high-rate deterioration of the cell than resistance against deterioration of a material for the cell based on the indicator.

A battery information processing method according to the present disclosure is a battery information processing method of processing information for manufacturing a battery assembly constructed by alternately stacking a plurality of cells and a plurality of spacers, and the battery information processing method includes obtaining information on a use history of the battery assembly used in a vehicle and generating assembly information for selecting a cell and a spacer to be used for manufacturing the battery assembly. In the generating assembly information, any one of first assembly information and second assembly information is generated by using the information on the use history. The first assembly information indicates selection of a cell and a spacer determined as being higher in resistance against deterioration of a material for the cell than resistance against high-rate deterioration of the cell based on a prescribed indicator. The second assembly information indicates selection of a cell and a spacer determined as being higher in resistance against high-rate deterioration of the cell than resistance against deterioration of the material for the cell based on the indicator.

The inventor of the present application has noted deterioration of a material itself for a cell as deterioration of a battery assembly other than high-rate deterioration. Specifically, when a battery assembly is used for a long period of time, a material itself for a cell gradually deteriorates under influence by heat. Though such deterioration of a material progresses more slowly than high-rate deterioration, it is unignorable when the battery assembly is used for a long period of time. Therefore, when a cell and a spacer are selected in consideration only of resistance against high-rate deterioration, it is difficult to achieve a long lifetime of a battery assembly. A cell and a spacer highly resistant against both of deterioration of a material and high-rate deterioration are not commonly available, and it is difficult to obtain such cell and spacer from a point of view of both of technology and cost.

In the battery information processing apparatus and the battery information processing method according to the present disclosure, information on a use history of a battery assembly used in a vehicle is obtained and any one of first assembly information and second assembly information is generated based on the information on the use history. Any of a cell and a spacer determined as being higher in resistance against deterioration of a material for a cell than resistance against high-rate deterioration of the cell (which may be referred to as a "cell highly resistant against material deterioration" and a "spacer highly resistant against material deterioration" below) and a cell and a spacer determined as being higher in resistance against high-rate deterioration of the cell than resistance against deterioration of a material for the cell (which may be referred to as a "cell highly resistant against high-rate deterioration" and a "spacer highly resistant against high-rate deterioration" below) can thus be selected in accordance with usage of a vehicle by a user. For example, depending on usage of a vehicle by a user, high-rate deterioration may not give rise to a problem. By providing a battery assembly constituted of a cell highly resistant against material deterioration and a spacer highly resistant against material deterioration to such a user, the battery assembly can have a longer lifetime.

Thus, according to the battery information processing apparatus and the battery information processing method, in manufacturing a battery assembly, appropriate cell and spacer can be selected in consideration of a difference in usage of a vehicle for each user. Manufacturing of a battery assembly includes both of manufacturing of a new battery assembly and reconstruction (rebuilding) of a battery assembly by replacing some of a plurality of cells constituting an established battery assembly.

A server which manages battery information or a terminal device different from such a server or a device for controlling a vehicle may be adopted as the battery information processing apparatus. When a terminal device is adopted as the battery information processing apparatus, for example, the terminal device may obtain information on a use history obtained by the server from the server and generate assembly information.

The battery information processing apparatus according to the present disclosure may further include a material deterioration amount calculator and a high-rate deterioration amount calculator. The material deterioration amount calculator is configured to calculate an amount of material deterioration (Dm) by using the information on the use history of the battery assembly. The high-rate deterioration amount calculator is configured to calculate an amount of high-rate deterioration (Dh) by using the information on the use history of the battery assembly. The amount of material deterioration refers to an amount of increase in resistance of a cell due to deterioration of a material for the cell under influence by heat. The amount of high-rate deterioration refers to an amount of increase in resistance of a cell due to high-rate deterioration of the cell. When a ratio (Dm/Dh) of the amount of material deterioration to the amount of high-rate deterioration is higher than a threshold value (Th), the assembly information generator may be configured to generate the first assembly information, and when the ratio (Dm/Dh) is lower than the threshold value (Th), the assembly information generator may be configured to generate the second assembly information.

The battery information processing apparatus configured as such calculates an amount of material deterioration and an amount of high-rate deterioration based on the information on the use history of the battery assembly used in the vehicle and selects a cell and a spacer to be used for manufacturing a battery assembly by using the amount of material deterioration and the amount of high rate deterioration. Specifically, a cell and a spacer suited to a user are selected based on a ratio (Dm/Dh) of the amount of material deterioration to the amount of high-rate deterioration.

A ratio (Dm/Dh) of an amount of material deterioration to an amount of high-rate deterioration corresponds to a value calculated by dividing an amount of material deterioration by an amount of high-rate deterioration. The threshold value can be set to any value. In an example where "1" is set as the threshold value, when an amount of material deterioration is smaller than an amount of high-rate deterioration, a ratio of the amount of material deterioration to the amount of high-rate deterioration is smaller than the threshold value (1).

With the ratio (Dm/Dh) of the amount of material deterioration to the amount of high-rate deterioration as above, in connection with usage of a vehicle of interest, which of deterioration of a material due to heat and high-rate deterioration is more likely to progress can readily and properly be determined. Appropriate cell and spacer suited to a user of the vehicle of interest can be selected based on a result of such determination. The configuration is particularly effective for a system which reconstructs (rebuilds) a battery assembly by replacing at least some of a plurality of cells constitution a battery assembly mounted on a vehicle.

A rate of increase in resistance may be employed as a parameter representing an amount of increase in resistance of a cell. The rate of increase in resistance corresponds to a rate of increase in resistance value from a reference resistance value (for example, a resistance value at the time of shipment).

In the battery information processing apparatus according to the present disclosure, the information on the use history obtained by the battery information obtaining device may include at least one of an environment of use of the battery assembly, a condition for traveling of the vehicle, a time period of traveling of the vehicle, and a frequency of traveling of the vehicle. When the information on the use history satisfies a prescribed condition, the assembly information generator may be configured to generate the first assembly information, and when the information on the use history does not satisfy the prescribed condition, the assembly information generator may be configured to generate the second assembly information.

Based on an environment of use of the battery assembly, a condition for traveling of the vehicle, a time period of traveling of the vehicle, and a frequency of traveling of the vehicle, which of deterioration of a material and high-rate deterioration is more likely to proceed can be determined in connection with usage of a vehicle of interest. For example, when a temperature at which a battery assembly is used is high, when a load in traveling of a vehicle is low, when a time period of traveling per one day is short, or when a frequency of traveling is low, deterioration of a material is more likely to proceed than high-rate deterioration. Therefore, at least one of a condition that a temperature of use representing the environment of use is higher than a prescribed value, a condition that a load in traveling representing the condition for traveling is lower than a prescribed value, a condition that a time period of traveling per one day representing the time period of traveling is shorter than a prescribed value, and a condition that a frequency representing the frequency of traveling is lower than a prescribed value may be defined as the prescribed condition that is necessary. Any value can independently be set as each prescribed value. A frequency of traveling of the vehicle may be represented by the number of times of traveling during a prescribed period. A time period of traveling of the vehicle may be a time period of traveling under a specific condition. Examples of the condition for traveling of the vehicle include a load in traveling or a state of charge (SOC) during traveling. When a time period of traveling at a low SOC is long, high-rate deterioration is more likely to proceed than deterioration of a material. The configuration is particularly effective in a system for newly manufacturing a battery assembly.

In the battery information processing apparatus according to the present disclosure, the indicator may include a weight per unit area of a negative electrode of the cell and a BET specific surface area of the negative electrode of the cell. A cell of which weight per unit area of the negative electrode is smaller than a prescribed value and of which BET specific surface area of the negative electrode is smaller than a prescribed value may be determined as being higher in resistance against deterioration of the material than resistance against high-rate deterioration.

According to such a configuration, a cell highly resistant against material deterioration and a cell highly resistant against high-rate deterioration can appropriately be selected. The weight per unit area refers to an amount of an active material per unit area. The BET specific surface area refers to a specific surface area measured with a BET method. Any value can independently be set as each prescribed value.

When a spacer to be used for manufacturing a battery assembly includes a plate-shaped main body and a protrusion which protrudes from the main body toward the cell, the indicator may include an area of contact between the protrusion and the cell. A spacer of which area of contact is greater than a prescribed value may be determined as being higher in resistance against deterioration of the material than resistance against the high-rate deterioration.

According to such a configuration, a spacer highly resistant against material deterioration and a spacer highly resistant against high-rate deterioration can appropriately be selected. The prescribed value can arbitrarily be set.

A battery manufacturing support apparatus according to the present disclosure is a battery manufacturing support apparatus for manufacturing a battery assembly by replacing a cell and a spacer which constitute the battery assembly, and the battery manufacturing support apparatus includes an obtaining device configured to obtain assembly information generated by any battery information processing apparatus described above and a selector configured to select a cell and a spacer to be used for manufacturing the battery assembly in accordance with the assembly information obtained by the obtaining device.

According to the battery manufacturing support apparatus, appropriate cell and spacer can be selected in consideration of a difference in usage of a vehicle for each user and a battery assembly can be manufactured with the selected cell and spacer.

A battery assembly according to the present disclosure is manufactured in accordance with assembly information generated by any battery information processing apparatus described above.

The battery assembly includes appropriate cell and spacer suited to usage of a vehicle by a user. Such a battery assembly is suitable for the user.

A method of manufacturing a battery assembly according to the present disclosure is a method of manufacturing a battery assembly constructed by alternately stacking a plurality of cells and a plurality of spacers, and the method includes obtaining assembly information for selecting a cell and a spacer to be used for manufacturing the battery assembly and manufacturing the battery assembly by using the cell and the spacer selected in accordance with the obtained assembly information. The obtained assembly information is any one of first assembly information and second assembly information generated by using information on a use history of the battery assembly used in a vehicle. The first assembly information indicates selection of a cell and a spacer determined as being higher in resistance against deterioration of a material for the cell than resistance against high-rate deterioration of the cell based on a prescribed indicator, and the second assembly information indicates selection of a cell and a spacer determined as being higher in resistance against high-rate deterioration of the cell than resistance against deterioration of the material for the cell based on the indicator.

According to the method of manufacturing a battery assembly, a battery assembly including appropriate cell and spacer suited to usage of a vehicle by a user can be manufactured. A battery assembly suitable for the user can be obtained.

The foregoing and other objects, features, aspects and advantages of the present disclosure will become more apparent from the following detailed description of the present disclosure when taken in conjunction with the accompanying drawings.

BRIEF DESCRIPTION OF THE DRAWINGS

FIG. 13 is a diagram shoving a replacement cell (cells A and B) selected in steps S151 and S152 in FIG. 10.

FIG. 14 is a diagram showing a replacement spacer (spacers and B) selected in steps S151 and S152 in FIG. 10.

FIG. 19 is a diagram showing a result of evaluation of a rate of increase in resistance after traveling and output after long-term use of a rebuilt product according to an Example and a rebuilt product according to a Comparative Example.

FIG. 20 is a diagram showing a replacement cell (cells A and B used for rebuilding in a modification of the first embodiment.

FIG. 21 is a diagram schematically showing an overall configuration of a battery manufacturing system according to a second embodiment.

FIG. 22 is a flowchart illustrating a procedure of processing performed by the ECU of the vehicle in the battery manufacturing system according to the second embodiment.

DESCRIPTION OF THE EMBODIMENTS

Figure 1:
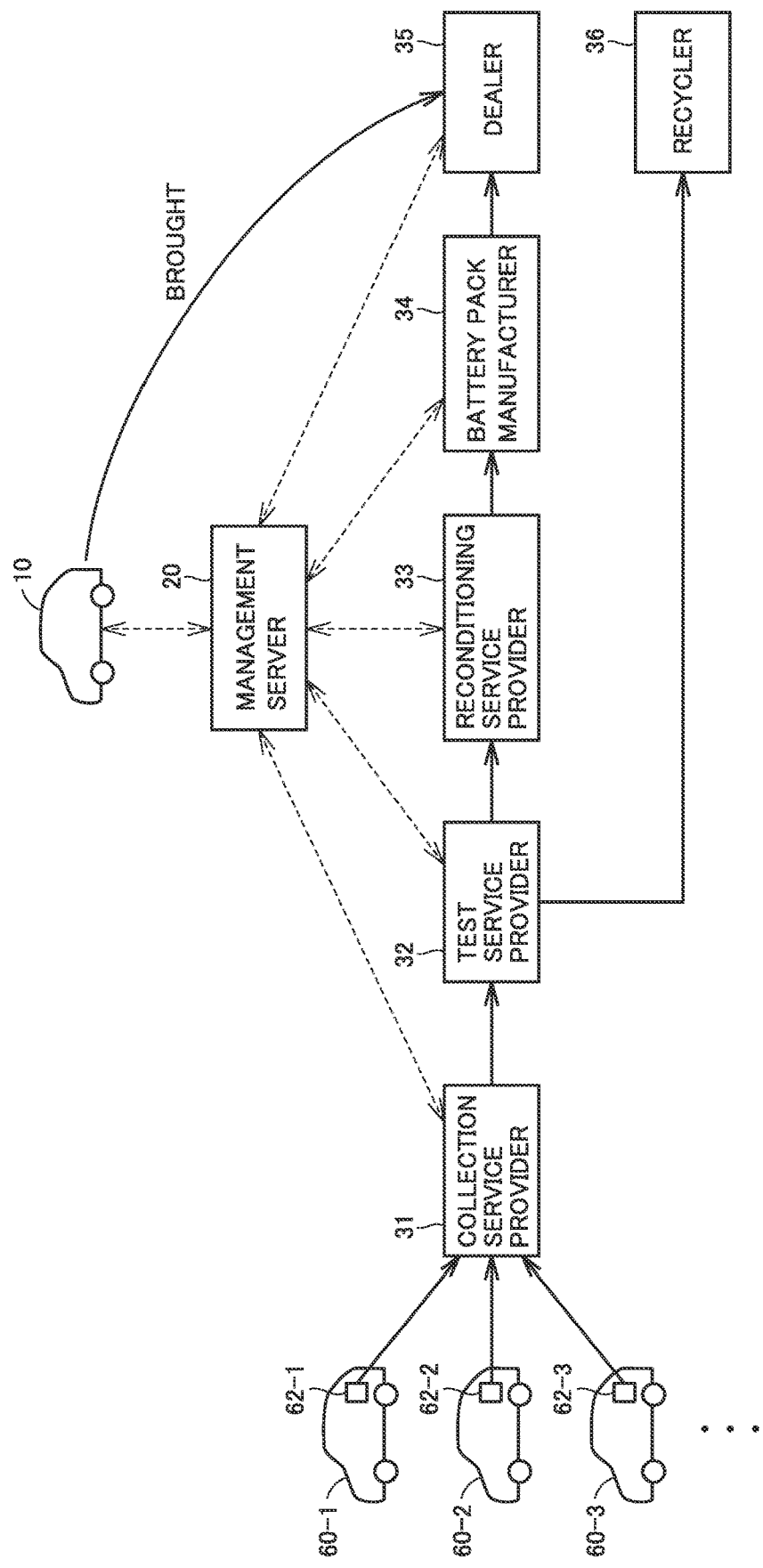
FIG. 1 is a diagram showing one manner of distribution from collection to manufacturing and sales of battery packs in the present disclosure.

An embodiment of the present disclosure will be described below in detail with reference to the drawings. The same or corresponding elements in the drawings have the same reference characters allotted and description thereof will not be repeated.

First Embodiment

FIG. 1 is a diagram showing one manner of distribution from collection to manufacturing and sales of battery packs in the present disclosure. A manner of distribution shown in FIG. is referred to as a "battery distribution model" below. In the battery distribution model, used battery packs are collected from a plurality of vehicles each incorporating battery packs, and battery packs are manufactured by using recyclable cells included in the collected battery packs and then sold.

"Manufacturing of a battery pack" in the present disclosure means manufacturing of a battery pack by replacing at least some of a plurality of cells included in a battery pack with replacement cells. Though the replacement cell is basically a recyclable cell taken out of a collected battery pack, it may be a new cell.

Referring to FIG. 1, a collection service provider 31 collects used battery packs from vehicles 60-1, 60-2, . . . . Vehicles 60-1, 60-2, . . . include battery packs 62-1, 62-2, . . . , respectively, and each battery pack includes a battery assembly including a plurality of cells. Collection service provider 31 disassembles collected battery packs and takes out cells from the battery packs. Each cell or each module which is a set of cells may be taken out of a battery pack.

In the battery distribution model, an ID for identifying each cell is provided and information on each cell is managed by a management server 20. Collection service provider 31 transmits an ID of each cell taken out of a battery pack to management server 20 by using a terminal device (not shown).

A test service provider 32 tests performance of each cell collected by collection service provider 31. Specifically, test service provider 32 tests electrical characteristics of a collected cell. For example, test service provider 32 tests electrical characteristics such as a capacity, a resistance value, an open circuit voltage (OCV), and a state of charge (SOC) of a cell. Test service provider 32 makes classification into a recyclable cell and a non-recyclable cell based on a result of the test, passes recyclable cells to a reconditioning service provider 33, and passes non-recyclable cells to a recycler 36. A result of test of each cell is transmitted to management server 20 by using a terminal device (not shown) of test service provider 32.

Reconditioning service provider 33 performs processing for reconditioning a cell determined as being recyclable by test service provider 32 (a replacement cell). By way of example, reconditioning service provider 33 restores a capacity of a cell by discharging the cell to an overdischarged state or charging the cell to an overcharged state. A cell determined as being minor in lowering in performance in the test by test service provider 32 does not have to be subjected to a reconditioning process by reconditioning service provider 33. A result of reconditioning of each cell is transmitted to management server 20 by using a terminal device (not shown) of reconditioning service provider 33.

A battery pack manufacturer 34 manufactures a battery pack by using cells reconditioned by reconditioning service provider 33. In this embodiment, battery pack manufacturer 34 obtains information for manufacturing a battery pack from management server 20 by using a terminal device (not shown) and manufactures a battery pack in accordance with the obtained information.

Specifically, in this embodiment, assembly information for manufacturing a rebuilt product of a battery pack to be mounted on a vehicle 10 is generated by management server 20 and transmitted to a terminal device of battery pack manufacturer 34. Battery pack manufacturer 34 manufactures (rebuilds) a battery pack for vehicle 10 by replacing a cell and a spacer included in a battery pack of vehicle 10 in accordance with the assembly rebuilding information.

A dealer 35 sells a battery pack manufactured by battery pack manufacturer 34 for vehicle use or for stationary use in a house or the like. In this embodiment, vehicle 10 is brought to dealer 35 and dealer 35 replaces battery packs in vehicle 10 with rebuilt products manufactured by battery pack manufacturer 34.

Recycler 36 disassembles cells determined as being non-recyclable by test service provider 32 for reclamation for use as new cells or as source materials for other products.

Figure 2:
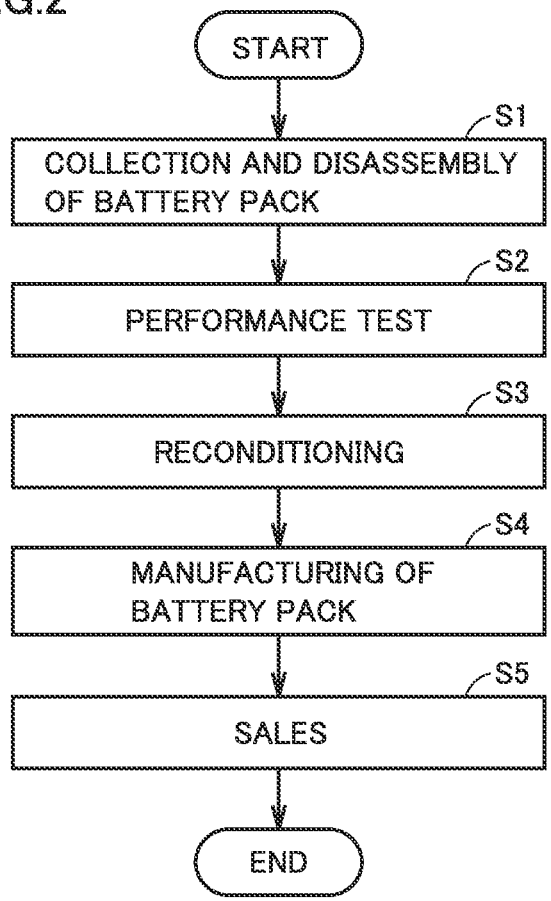
FIG. 2 is a diagram showing a flow of processing in a battery distribution model shown in FIG. 1.

FIG. 2 is a diagram showing a flow of processing in the battery distribution model shown in FIG. 1. Referring FIG. 1 together with FIG. 2, collection service provider 31 collects used battery packs from vehicles 60-1, 60-2, . . . and disassembles them (step S1) and takes out used cells from the battery packs.

Each used cell taken out of the battery pack is passed to test service provider 32 and test service provider 32 tests performance of each used cell (step S2). Specifically, electrical characteristics (a capacity and the like) of each cell are tested as described above. As a result of the performance test, the cells are classified into recyclable cells and non-recyclable cells and the non-recyclable cells are passed to recycler 36.

The cell determined as being recyclable as a result of the performance test is passed to reconditioning service provider 33 and reconditioning service provider 33 performs a process for reconditioning the cell (step S3). For example, a capacity of a cell is restored by discharging the cell to the overdischarged state or charging the cell to the overcharged state.

The reconditioned cell is passed to battery pack manufacturer 34 and battery pack manufacturer 34 manufactures a battery pack by using the reconditioned cell (step S4). In this embodiment, information (assembly information) for manufacturing a battery pack is generated by management server 20 and battery pack manufacturer 34 manufactures a battery pack in accordance with the assembly information.

The battery pack manufactured by battery pack manufacturer 34 is passed to dealer 35 and sold for vehicle use or for stationary use in a house or the like (step S5).

Referring again to FIG. 1, vehicle 10 is a vehicle on which a battery pack is mounted (not shown) and for which a battery pack is rebuilt in the battery distribution model (vehicle 10 may be referred to as a "vehicle of interest" below). As described above, in this embodiment, a battery pack for vehicle 10 is reconstructed by replacing at least some of a plurality of cells included in the battery pack mounted on vehicle 10 with replacement cells.

Though details will be described later, generally, use history information of a battery assembly in a battery pack mounted on vehicle 10 is transmitted from vehicle 10 to management server 20 and accumulated in management server 20. Management server 20 accumulates information on recyclable cells included in battery packs 62-1, 62-2, . . . collected from vehicles 60-1, 60-2, . . . incorporating battery packs.

When a user of vehicle 10 (vehicle of interest) who desires replacement of a battery pack brings vehicle 10 to dealer 35, information for identifying vehicle 10 is transmitted from a terminal device of dealer 35 to management server 20. Management server 20 finds a ratio of an amount of deterioration of a material to an amount of high-rate deterioration of a battery assembly (details of which will be described later) by using accumulated information on a use history of the battery assembly of vehicle 10. Then, management server 20 generates assembly information for construction a rebuilt product of a battery pack to be mounted on vehicle 10 by referring to the ratio of the amount of deterioration of the material to the amount of high-rate deterioration of the battery assembly and information on recyclable cells. The assembly information designates a cell and a spacer to be used for manufacturing a battery assembly.

The generated assembly information is transmitted from management server 20 to a terminal device of battery pack manufacturer 34. Battery pack manufacturer 34 selects a cell and a spacer based on the assembly information from among replacement cells and replacement spacers managed by battery pack manufacturer 34, and at least some of cells and spacers included in the battery pack are replaced with the selected cell and spacer. The battery pack of vehicle 10 is thus manufactured (rebuilt). A new product or a secondhand product (recycled product) may be used for the replacement cell and the replacement spacer. For example, a cell reconditioned by reconditioning service provider 33 may be employed as a replacement cell.

The battery pack (rebuilt product) manufactured as above is delivered to dealer 35 to which vehicle 10 has been brought and the battery pack of vehicle 10 is replaced with the rebuilt product at dealer 35.

Though collection service provider 31, test service provider 32, reconditioning service provider 33, battery pack manufacturer 34, and dealer 35 are individual service providers above, classification of the service providers is not limited as such. For example, a single service provider may serve as test service provider 32 and reconditioning service provider 33. Alternatively, collection service provider 31 may be divided into a service provider which collects battery packs and a service provider which disassembles collected battery packs. Locations of each service provider and each dealer are not limited. Locations of each service provider and each dealer may be different or a plurality of service providers or dealers may be located at the same place.

Though each cell is tested and reconditioned above, each module which is a set of some cells may be tested or reconditioned.

Figure 3:
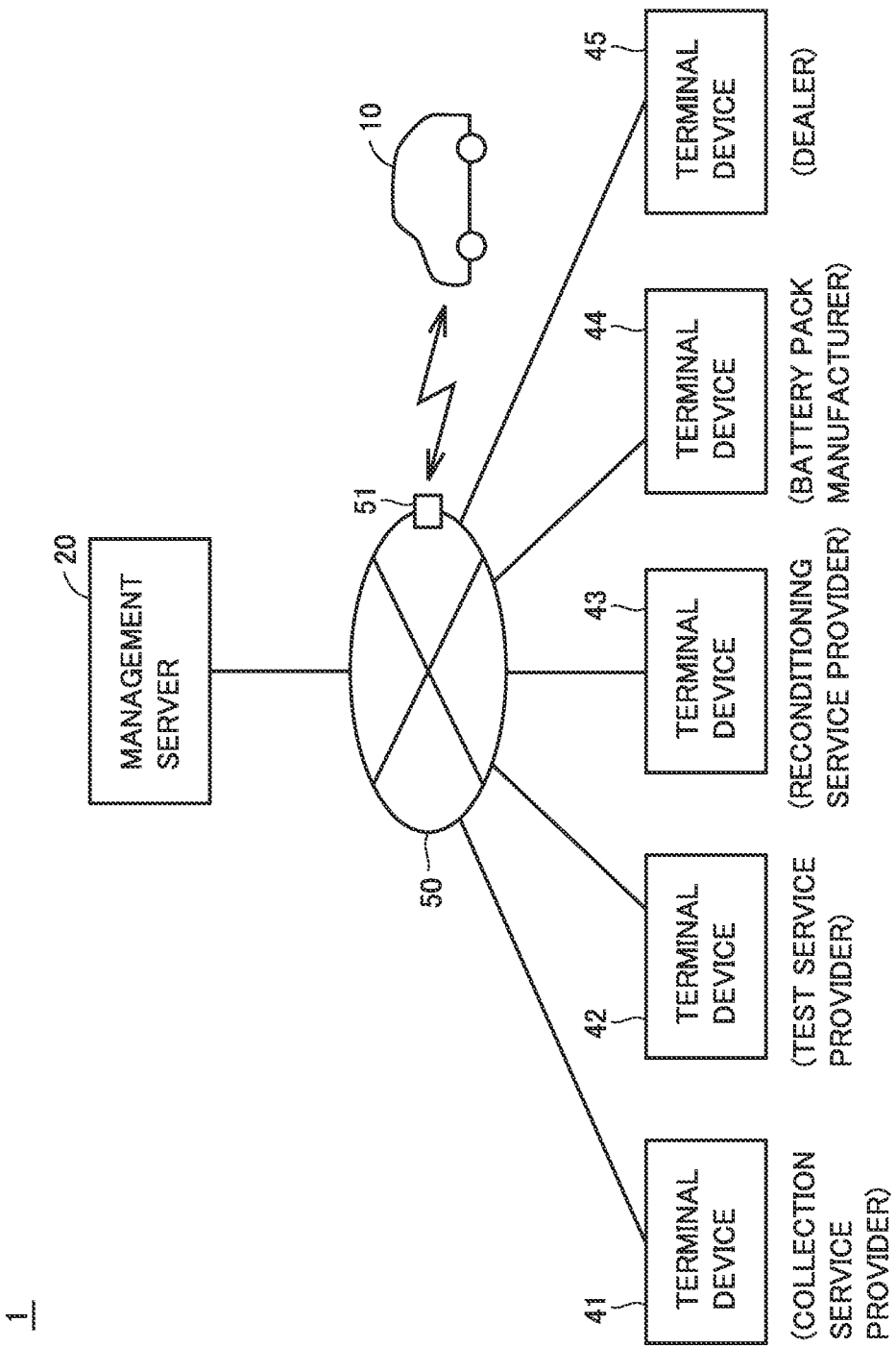
FIG. 3 is a diagram showing an exemplary configuration of a battery management system applied to the battery distribution model shown in FIG. 1.

FIG. 3 is a diagram showing an exemplary configuration of a battery management system applied to the battery distribution model shown in FIG. 1. Retelling to FIG. 3, a battery management system 1 includes vehicle 10, management server 20, terminal devices 41 to 45, and a communication network 50.

Vehicle 10, management server 20, and terminal devices 41 to 45 are configured to be able to communicate with one another through communication network 50 such as the Internet or telephone lines. Vehicle 10 is configured to be able to transmit and receive information to and from a base station 51 on communication network 50 through wireless communication.

Terminal device 41 is a terminal device of collection service provider 31 and terminal device 42 is a terminal device of test service provider 32. Terminal device 43 is a terminal device of reconditioning service provider 33 and terminal device 44 is a terminal device of battery pack manufacturer 34. Terminal device 45 is a terminal device of dealer 35.

Figure 4:
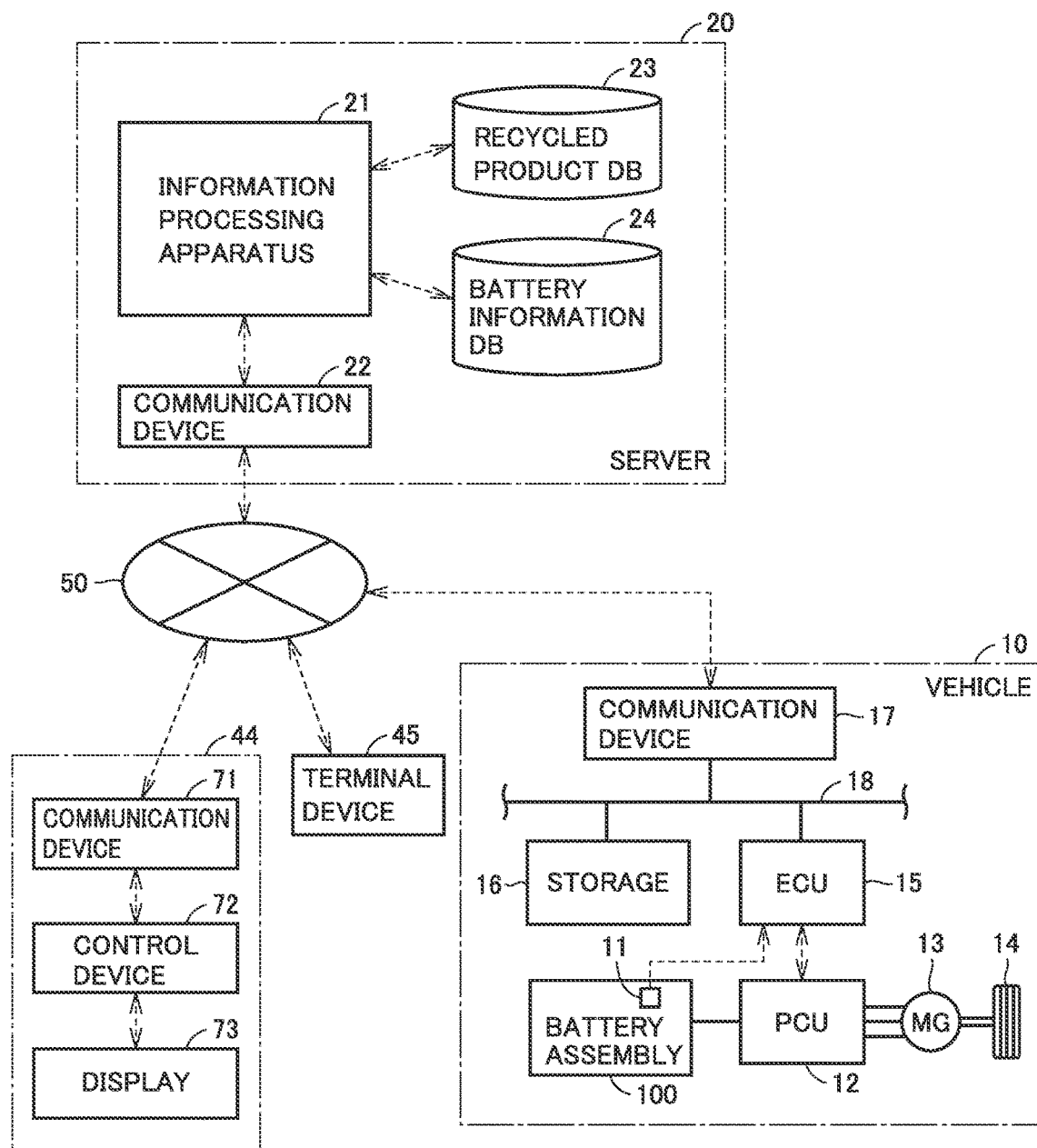
FIG. 4 is a diagram showing in detail a configuration of a vehicle, a management server, and a terminal device of a battery pack manufacturer shown in FIG. 3.

FIG. 4 is a diagram showing in detail a configuration of vehicle 10, management server 20, and terminal device 44 of battery pack manufacturer 34 shown in FIG. 3. Referring to FIG. 4, vehicle 10 includes a battery pack including a battery assembly 100, a battery monitoring unit 11, a power control unit (PCU) 12, a motor generator (MG) 13, a drive wheel 14, an electronic control unit (ECU) 15, a storage 16 (for example, a non-volatile memory), a communication device 17, and a communication line 18. ECU 15, storage 16, and communication device 17 are connected to one another through communication line 18 and configured to be able to transmit and receive information to and from one another.

Vehicle 10 is configured to travel with electric power stored in battery assembly 100. Vehicle 10 may be an electric vehicle which can travel with only electric power stored in battery assembly 100 or a hybrid vehicle which can travel with both of electric power stored in battery assembly 100 and output from an engine (not shown).

Battery assembly 100 is configured, for example, such that a plurality of cells are connected in series and/or in parallel as appropriate. Battery assembly 100 supplies electric power for driving drive wheel 14 to PCU 12 by MG 13.

Figure 5:
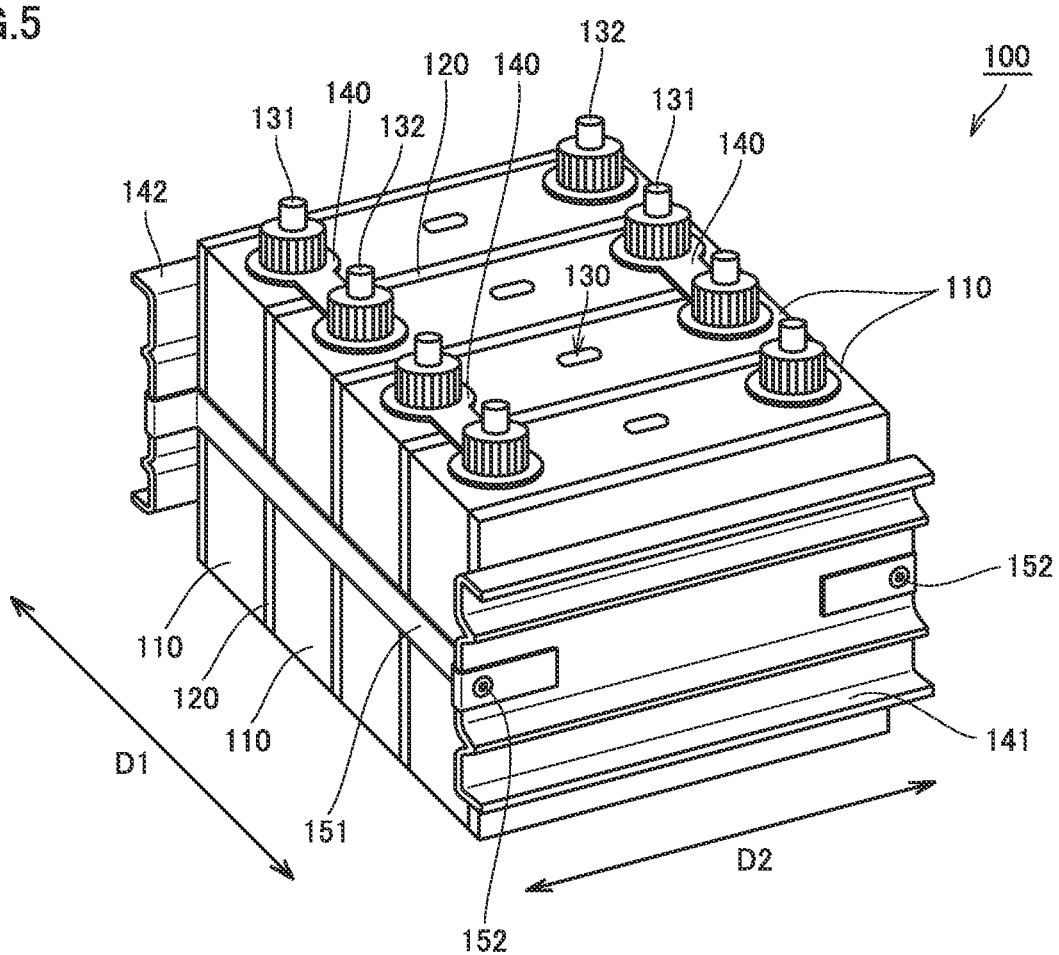
FIG. 5 is a perspective view showing a schematic structure of a battery assembly shown in FIG. 4.
Figure 6:
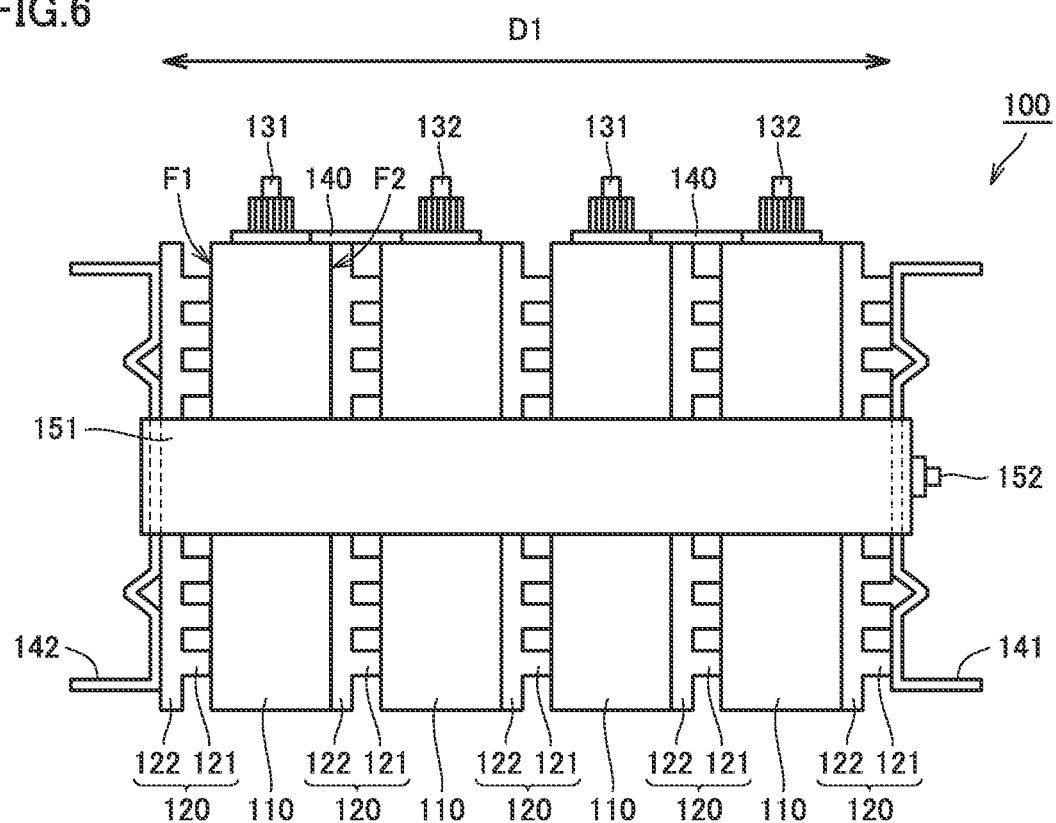
FIG. 6 is a side view of the battery assembly shown in FIG. 5.
Figure 7:
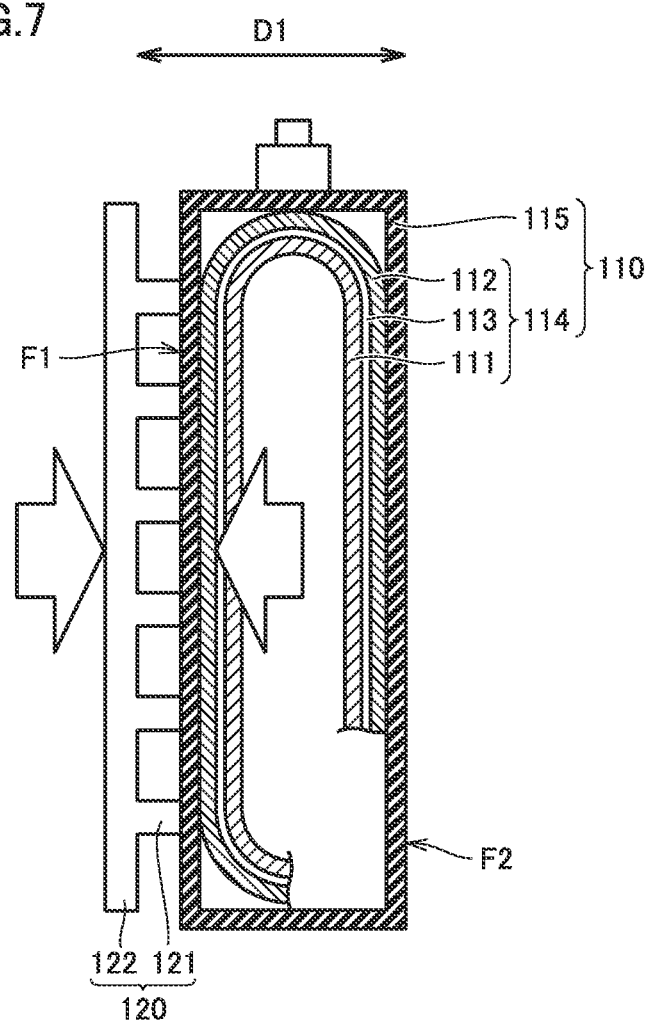
FIG. 7 is a cross-sectional view showing an internal structure of a cell in the battery assembly shown in FIG. 5.

FIGS. 5 to 7 show a construction of battery assembly 100 in detail. In FIGS. 5 to 7, a direction of alignment D1 represents a direction in which a plurality of cells 110 constituting battery assembly 100 are aligned and a direction of width D2 represents a direction orthogonal to direction of alignment D1.

Referring to FIG. 5, battery assembly 100 is constructed by alternately stacking a plurality of cells 110 and a plurality of spacers 120 in direction of alignment D1. Battery assembly 100 includes a plurality of cells 110 aligned in direction of alignment D1 and spacers 120 each interposed between cells 110. The number of cells 110 is, for example, not smaller than two and not greater than twenty. The number of cells 110 can be modified as appropriate in accordance with output required of battery assembly 100.

Cell 110 is a non-aqueous electrolyte secondary battery (for example, a lithium ion battery). Cell 110 includes a positive electrode terminal 131 and a negative electrode terminal 132. A gas emission valve 130 is provided between positive electrode terminal 131 and negative electrode terminal 132. Gas emission valve 130 is a valve for emitting, when abnormal reaction occurs in cell 110, gas generated due to the abnormal reaction to the outside of cell 110. Battery assembly 100 may further include a duct for exhausting gas emitted to the outside through gas emission valve 130 of each cell.

A plurality of cells 110 shown in FIG. 5 are electrically connected in series. Specifically, a plurality of cells 110 constituting battery assembly 100 are aligned with every other cell being in the same orientation. Positive electrode terminal 131 of one cell 110 and negative electrode terminal 132 of another adjacent cell 110 are electrically connected to each other through a connection member (bus bar) 140. Restraint plates 141 and 142 are arranged at respective opposing ends of battery assembly 100 in direction of alignment D1. Restraint plate 141 and restraint plate 142 are connected to each other by a restraint hand 151. Restraint band 151 is coupled to restraint plates 141 and 142 by a screw 152. By fastening screw 152, a plurality of cells 110 and spacers 120 can be fixed by restraint band 151 and restraint plates 141 and 142. By fastening screw 152, a pressure (binding force) is applied to cells 110 and spacers 120.

Referring to FIG. 6, spacer 120 includes a plate-shaped main body 122 and a protrusion 121 (for example, a rib) protruding from main body 122 toward cell 110. Main body 122 and protrusion 121 are formed, for example, integrally. Without being limited as such, protrusion 121 and main body 122 may be separate from each other. Protrusion 121 may be provided as being attachable to and removable from main body 122.

Of two main surfaces F1 and F2 of cell 110 (surfaces at opposing ends in direction of alignment D1), protrusion 121 comes in contact with main surface F1 and main body 122 comes in contact with main surface F2. Substantially the entire region of main surface F2 of cell 110 is in contact with main body 122. Main surface F1 of cell 110 is partially in contact with protrusion 121. Though details will be described later, an area of contact between cell 110 and protrusion 121 varies depending on a two-dimensional shape of protrusion 121 (a shape viewed in direction of alignment D1). Protrusion 121 is formed, for example, like teeth of a comb. With application of binding force from restraint plates 141 and 142, protrusion 121 of spacer 120 presses main surface F1 of cell 110. Spacer 120 is composed, for example, of a resin. A material for spacer 120, however, is not limited to the resin but may be a metal.

Referring to FIG. 7, cell 110 includes an electrode assembly 114 and a case 115 (a battery case). Electrode assembly 114 is accommodated in case 115. Though not shown, an electrolyte is also accommodated in case 115. The electrolyte is introduced in electrode assembly 114 as electrode assembly 114 is immersed in the electrolyte.

Electrode assembly 114 is a wound type electrode assembly formed by winding a stack of a positive electrode plate 111, a separator 113, and a negative electrode plate 112. Positive electrode plate 111 and negative electrode plate 112 are stacked with separator 113 being interposed. Electrode assembly 114 may be a stack type electrode assembly without being limited to the wound type electrode assembly.

Positive electrode plate 111 includes a positive electrode current collector (for example, an aluminum foil) and a positive electrode active material layer. The positive electrode active material layer is formed on opposing surfaces of the positive electrode current collector, for example, by coating the surfaces of the positive electrode current collector with a positive electrode composite material containing a positive electrode active material. Negative electrode plate 112 includes a negative electrode current collector (for example, a copper foil) and a negative electrode active material layer. The negative electrode active material layer is formed on opposing surfaces of the negative electrode current collector, for example, by coating the surfaces of the negative electrode current collector with a negative electrode composite material containing a negative electrode active material. Separator 113 is made, for example, of a finely porous film. In the presence of pores in separator 113, the electrolyte tends to be held in the pores.

Examples of the positive electrode active material include a lithium-containing nickel cobalt manganese composite oxide with lamellar rock salt type crystal structure. The positive electrode active material layer may contain, in addition to the positive electrode active material, at least one of a conductor material (for example, acetylene black) and a binder (for example, polyvinylidene difluoride). Examples of the negative electrode active material include a carbon based material (specifically, graphite). The negative electrode active material layer may contain, in addition to the negative electrode active material, at least one of a thickener (for example, carboxymethyl cellulose) and a binder (for example, styrene-butadiene rubber). Examples of the material for separator 113 include a polyolefin-based resin (specifically, polyethylene or polypropylene).

The electrolyte contains an aprotic solvent and lithium salt (for example, $LiPF_6$) dissolved in the solvent. Examples of the aprotic solvent include ethylene carbonate (EC), ethyl methyl carbonate (EMC), dimethyl carbonate (DMC), or diethyl carbonate (DEC). Two or more types of solvents may be used as being mixed.

Case 115 is, for example, prismatic. The prismatic case has an outer profile in a shape of a parallelepiped (for example, a parallelepiped of a flat profile). Examples of a material for case 115 include an Al alloy.

Referring again to FIG. 4, battery monitoring unit 11 includes various sensors and is configured to monitor a state of battery assembly 100 constructed above. Battery monitoring unit 11 includes, for example, a voltage sensor, a current sensor, and a temperature sensor. The voltage sensor detects a voltage of battery assembly 100 and outputs a result to ECU 15. The current sensor detects a current of battery assembly 100 and outputs a result to ECU 15. The temperature sensor detects a temperature of battery assembly 100 and outputs a result to ECU 15.

MG 13 is a rotating electric machine and it is implemented, for example, by a three-phase alternating-current (AC) motor generator. MG 13 is driven by PCU 12 and rotates drive wheel 14. MG 13 can also carry but regeneration during braking of vehicle 10. Electric power generated by MG 13 is rectified by PCU 12 and battery assembly 100 is charged therewith.

PCU 12 includes an inverter and a converter (neither of which is shown), and drives MG 13 in accordance with a drive signal from ECU 15. PCU 12 converts electric power stored in battery assembly 100 into AC power and supplies AC power to MG 13 during driving for power running by MG 13, and rectifies electric power generated by MG 13 and supplies electric power to battery assembly 100 during driving for regeneration by MG 13 (during braking of vehicle 10).

ECU 15 includes a central processing unit (CPU), a memory (a read only memory (ROM) and a random access memory (RAM)), and an input and output port for input and output of various signals (none of which is shown). ECU 15 controls PCU 12 and controls charging and discharging of battery assembly 100 such that a desired state of vehicle 10 is achieved. ECU 15 obtains information on a use history (a temperature, a current, and a state of charge (SOC)) of battery assembly 100 and outputs the obtained information on the use history to storage 16.

In battery management system 1, management server 20 generates assembly information for manufacturing a rebuilt product. Specifically, management server 20 generates assembly information by using a ratio of an amount of material deterioration to an amount of high-rate deterioration. The amount of material deterioration refers to an amount of increase in resistance in a cell due to deterioration of a material for a cell under the influence by heat. The amount of high-rate deterioration refers to an amount of increase in resistance in a cell due to high-rate deterioration of the cell. The amount of high-rate deterioration may be denoted as "Dh" and the amount of material deterioration may be denoted as "Dm" below. A ratio of Dm to may be referred to as a "ratio Dm/Dh."

ECU 15 obtains information on a use history of battery assembly 100 for calculating Dh and Dm and has storage 16 accumulate the use history information, and reads the use history information from storage 16 and transmits the use history information to management server 20 through communication device 17.

Management server 20 includes an information processing apparatus 21, a communication device 22, a recycled product database (DB) 23, and a battery information database (DB) 24.

Recycled product DB 23 accumulates information on cells included in secondhand battery packs 62-1, 62-2, . . . (FIG. 1) collected b collection service provider 31 and determined as bring recyclable by test service provider 32 in association with an ID (an identification sign) for identifying each cell. This information includes information on a cell in an initial state (for example, traceability data stored at the time of shipment) and information on a used cell. The traceability data of a cell includes information representing an initial state of a cell (a capacity of a cell, a resistance of a cell, a thickness of an electrode, a weight per unit area of an electrode, and a BET specific surface area of an electrode). The information on a used cell is collected, for example, by evaluating performance of each cell (evaluating a state of deterioration) in test service provider 32, and includes an indicator indicating a state of deterioration of each cell and less likeliness of deterioration of each cell (a rate of deterioration, a capacity of a cell, and a resistance of a cell).

Battery information DB 24 stores initial information of battery assembly 100 (for example, traceability data stored at the time of shipment) and battery information periodically received from vehicle 10 (for example, information on a use history of battery assembly 100) in association with an ID (an identification sign) for identifying vehicle 10.

Initial information on battery assembly 100 further includes information representing relation between a ΣD value and an amount of high-rate deterioration (Dh) (which may be referred to as "ΣD value-Dh correspondence information" below), information representing relation between an SOC, a temperature (T), and a forgetting factor (A) (which may be referred to as "SOC-T-A correspondence information" below), information representing relation between an SOC, a temperature (T), and a limit value (C) (which may be referred to as "SOC-T-C correspondence information" below), and a current coefficient (B).

The ΣD value is an integrated value of an evaluation value D for evaluating high-rate deterioration. Evaluation value D is a quantitative value for evaluating a deterioration component which lowers input and output performance of cell 110 due to an uneven ion concentration in a non-aqueous electrolyte caused by charging and discharging. The forgetting factor (A) is a factor corresponding to a rate of diffusion of ions in the electrolyte in a cell and used for calculation of a ΣD value. The current coefficient (B) and the limit value (C) are also parameters used for calculation of a ΣD value. Details of a method of calculating a ΣD value will be described later (see step S130 in FIG. 10).

The initial information on battery assembly 100 further includes information representing relation between a temperature (T) and a rate of deterioration (β) (which may be referred to as "T-β correspondence information" below). The rate of deterioration (β) is represented by a coefficient corresponding to a rate of increase in internal resistance of a cell and used for finding an amount of material deterioration (Dm). Details of how to find Dm will be described later (see step S130 FIG. 10).

The current coefficient (B) and each piece of correspondence information can be obtained in advance through experiments. The current coefficient (B) and each piece of correspondence information obtained through experiments are stored, for example, in battery information DB 24 at the time of shipment of battery assembly 100. With correspondence information which associates two parameters with each other (for example, ΣD value-Dh correspondence information and T-β (correspondence information), a numeric value of one parameter can be found based on a numeric value of another parameter. With correspondence information which associates three parameters with one another for example, SOC-T-A correspondence information and SOC-T-C correspondence information), a numeric value of one parameter can be found based on numeric values of two parameters. The SOC-T-A correspondence information defines relation between an SOC, a temperature, and a forgetting factor, and defines, for example, such relation that a forgetting factor is greater as a temperature is higher with art SOC being the same, and a forgetting factor is greater as an SOC is higher with a temperature being the same. The SOC-T-C correspondence information defines relation between an SOC, a temperature, and a limit value, and defines, for example, such relation that a limit value is greater as a temperature is higher with an SOC being the same, and a limit value is greater as an SOC is higher with a temperature being the same. Each piece of correspondence information may be in a format of a map, a table, a mathematical expression, or a model.

The initial information on battery assembly 100 further includes information representing an initial state of a cell (a capacity of a cell, a resistance of a cell, a thickness of an electrode, a weight per unit area of an electrode, and a BET specific surface area of an electrode) and information on process variation of a cell. The information on process variation of a cell includes process variation data on each of a weight per unit area and a BET specific surface area of an electrode (for example, an upper limit value, a median value, and a lower limit value of process variation).

Information on a use history of battery assembly 100 is periodically collected by ECU 15 of vehicle 10 and transmitted from vehicle 10 to management server 20 at prescribed timing. Management server 20 receives the use history information and stores the use history information in battery information DB 24.

Information processing apparatus 21 includes a CPU, a memory, and an input and output buffer (none of which is shown). When information processing apparatus 21 receives information for identifying vehicle 10 of which battery assembly 100 is to be rebuilt from terminal device 45 of dealer 35 through communication device 22, it generates assembly information for rebuilding battery assembly 100 by using data on vehicle 10 stored in battery information DB 24 and data on recyclable cells (replacement cells) stored in recycled product DB 23. Details of specific processing for generating assembly information will be described later.

Information processing apparatus 21 transmits the generated assembly information to terminal device 44 of battery pack manufacturer 34 through communication device 22. Battery pack manufacturer 34 thus produces a rebuilt product of battery assembly 100 for vehicle 10 in accordance with the assembly information generated by management server 20.

Terminal device 44 of battery pack manufacturer 34 includes a communication device 71, a control device 72, and a display 73. Communication device 71 obtains assembly information generated by management server 20 from management server 20. Control device 72 selects a cell and a spacer from among replacement cells and replacement spacers in accordance with the obtained assembly information, and has display 73 show information on the selected cell and spacer. Battery pack manufacturer 34 manufactures (rebuilds) battery assembly 100 for vehicle 10 based on the information on the cell and the spacer shown on display 73.

Terminal device 44 corresponds to one embodiment of the "battery manufacturing support apparatus" in the present disclosure. Communication device 71 corresponds to one embodiment of the "obtaining device" in the present disclosure and control device 72 corresponds to one embodiment of the "selector" in the present disclosure.

High-rate deterioration is generally known as deterioration of a battery assembly. Deterioration of the battery assembly is not limited to high-rate deterioration but the battery assembly may also deteriorate due to another factor. Therefore, it is not necessarily appropriate to employ a cell and a spacer highly resistant against high-rate deterioration.

The inventor of the present application has noted deterioration of a material itself for a cell as deterioration of a battery assembly other than high-rate deterioration. Specifically, when a battery assembly is used for a long period of time, a material itself for a cell gradually deteriorates under the influence by heat. Though such deterioration of a material progresses more slowly than high-rate deterioration, it is unignorable when the battery assembly is used for a long period of time. Therefore, when a cell and a spacer are selected in consideration only of resistance against high-rate deterioration, it is difficult to achieve a long lifetime of a battery assembly. A cell and a spacer highly resistant against both of deterioration of a material and high-rate deterioration are not commonly available, and it is difficult to obtain such cell and spacer from a point of view of both of technology and cost.

How a cell constituting a battery assembly deteriorates varies depending on usage of the battery assembly. If a battery assembly is rebuilt without taking into consideration a difference in usage of a vehicle for each user, a rebuilt product suited to the user is not necessarily obtained.

In battery management system 1 according to the first embodiment, a rebuilt product is produced in consideration of a difference in usage of a vehicle for each user. Generally, battery management system 1 obtains information on a use history of battery assembly 100 used in vehicle 10 and generates any one of first assembly information and second assembly information based on the use history information. The first assembly information is rebuilding information indicating selection of a cell highly resistant against material deterioration and a sparer highly resistant against material deterioration (a cell and a spacer determined as being higher in resistance against deterioration of a material for a cell than resistance against high-rate deterioration of the cell based on a prescribed indicator such as a weight per unit area and a BET specific surface area). The second assembly information is rebuilding information indicating selection of a cell highly resistant against high-rate deterioration and a spacer highly resistant against high-rate deterioration (a cell and a spacer determined as being higher in resistance against high-rate deterioration of a cell than resistance against deterioration of a material for the cell based on the indicator).

With battery management system 1 as above, battery assembly 100 can be rebuilt (manufactured) by using a cell and a spacer suited to usage of vehicle 10 by a user. A method of producing a rebuilt product in battery management system 1 will be described below in detail with reference to FIGS. 8 to 18.

Figure 8:
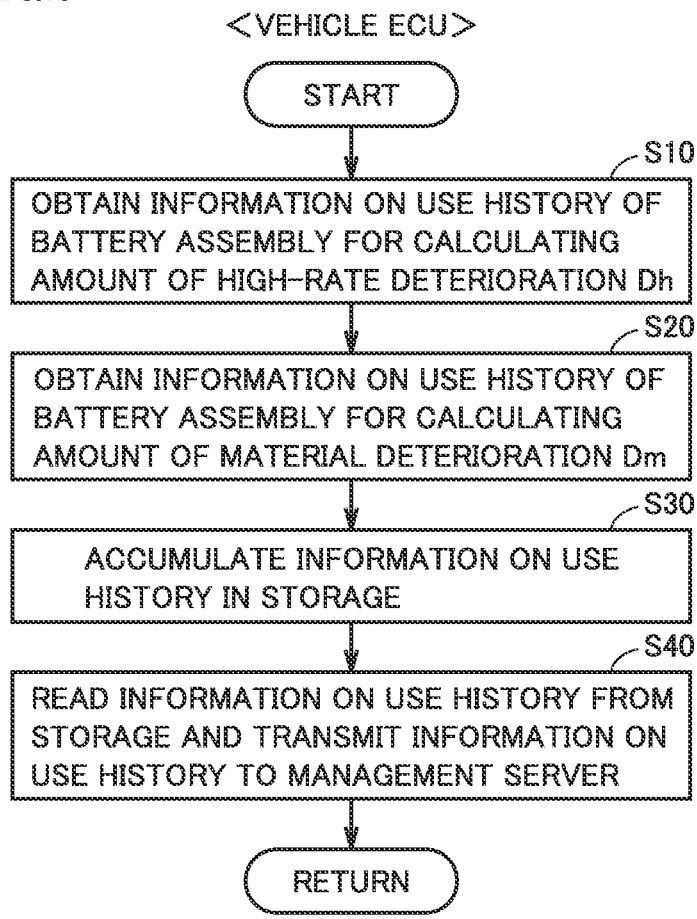
FIG. 8 is a flowchart illustrating a procedure of processing performed by an ECU of a vehicle in a battery manufacturing system according to a first embodiment.

FIG. 8 is a flowchart illustrating a procedure of processing performed by ECU 15 of vehicle 10. Processing shown in this flowchart is repeatedly performed by being called from a main routine every prescribed time or when a prescribed condition is satisfied.

Referring to FIG. 8, ECU 15 obtains information on a use history (which may be referred to as "Dh relevant information" below) of battery assembly 100 for calculating an amount of high-rate deterioration (Dh) (step S10). Dh relevant information includes, for example, a current value and an SOC of battery assembly 100. A current value of battery assembly 100 can be obtained, for example, from battery monitoring unit 11. An SOC can be estimated, for example, from a current value and a voltage value of battery assembly 100. An SOC is defined as a ratio (for example, a percentage) of a current charge capacity to a full charge capacity. Any method of calculating an SOC is applicable, and a technique of integrating current values (Coulomb counting)

or a technique of estimating an open circuit voltage (OCV) can also be adopted. An amount of high-rate deterioration (Dh) is calculated by using a current value and an SOC obtained here (specifically, see step S130 in FIG. 10 which will be described later). A temperature of battery assembly 100 is also used for calculation of Dh, however, a temperature of battery assembly 100 is obtained in a next step S20 and hence it is not obtained in step S10.

Then, ECU 15 obtains information on a use history of battery assembly 100 for calculating an amount of material deterioration (Dm) (which may be referred to as "Dm relevant information" below) from battery monitoring unit 11 (step S20). The Dm relevant information includes, for example, a temperature of battery assembly 100. When a temperature is varied from place to place in entire battery assembly 100, for example, a highest temperature can be adopted as a temperature of battery assembly 100. An amount of material deterioration (Dm) is calculated by using a temperature of battery assembly 100 obtained here (specifically, see step S130 in FIG. 10 which will be described later).

ECU 15 has storage 16 accumulate the use history information including the Dh relevant information and the Dm relevant information (step S30). The Dh relevant information further includes a temperature of battery assembly 100 obtained in step S20 and a cycle time, in addition to data obtained in step S10. The cycle time refers to a time elapsed since previous obtainment of data until present obtainment of data, and corresponds to a control cycle. The use history information may further include the number of times of charging of battery assembly 100 and a distance of travel of vehicle 10, in addition to the Dh relevant information and the Dm relevant information.

ECU 15 reads the information on the use history of battery assembly 100 accumulated in storage 16 from storage 16 and transmits the use history information to management server 20 through communication device 17 (step S40).

Figure 9:
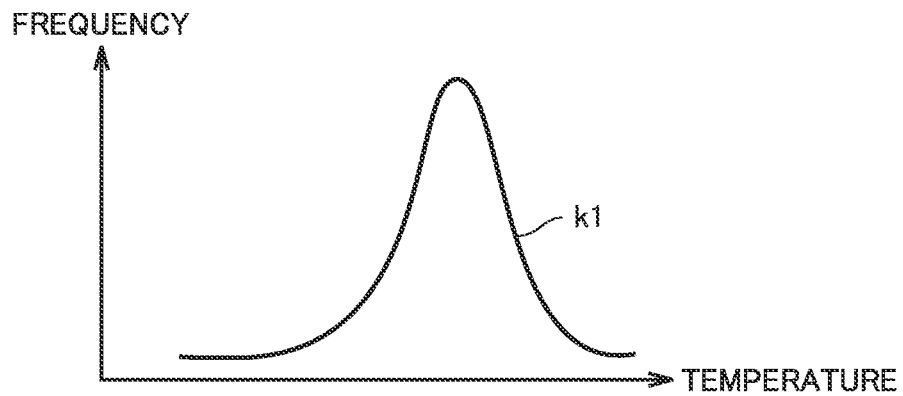
FIG. 9 is a diagram showing one example of information on a use history of a battery assembly (a temperature frequency distribution).

As a series of processing shown in FIG. 8 is repeatedly performed, a temperature frequency distribution of battery assembly 100 is output to management server 20 as the Dm relevant information. FIG. 9 shows one example of a temperature frequency distribution of battery assembly 100.

Referring to FIG. 9, the abscissa represents a temperature of battery assembly 100 and the ordinate represents a frequency (that is, an integrated number of times that a temperature obtained in step S20 attained to a temperature represented on the abscissa). A solid line k1 represents a frequency for each temperature (temperature frequency distribution). In the temperature frequency distribution shown with solid line k1, a frequency attains to a peak at a specific temperature and a frequency is lower as a temperature deviates from the peak temperature.

Through the processing shown in FIG. 8, ECU 15 obtains information on a use history of battery assembly 100 and transmits the use history information to management server 20. Management server 20 accumulates the received information on the use history of battery assembly 100 in battery information DB 24. The information on the use history of battery assembly 100 may be transmitted from ECU 15 to management server 20 (step S40 may be performed) at any timing. For example, in step S40, ECU 15 may periodically read information on a use history of battery assembly 100 accumulated in storage 16 from storage 16 with a prescribed period and transmit the use history information to management server 20 through communication device 17. Specifically, when it is not timing to perform step S40, step S40 may be skipped and steps S10 to S30 may repeatedly be performed. At the timing to perform step S40, the information on the use history of battery assembly 100 obtained during a period from previous transmission until present transmission may collectively be transmitted to management server 20 in step S40.

Figure 10:
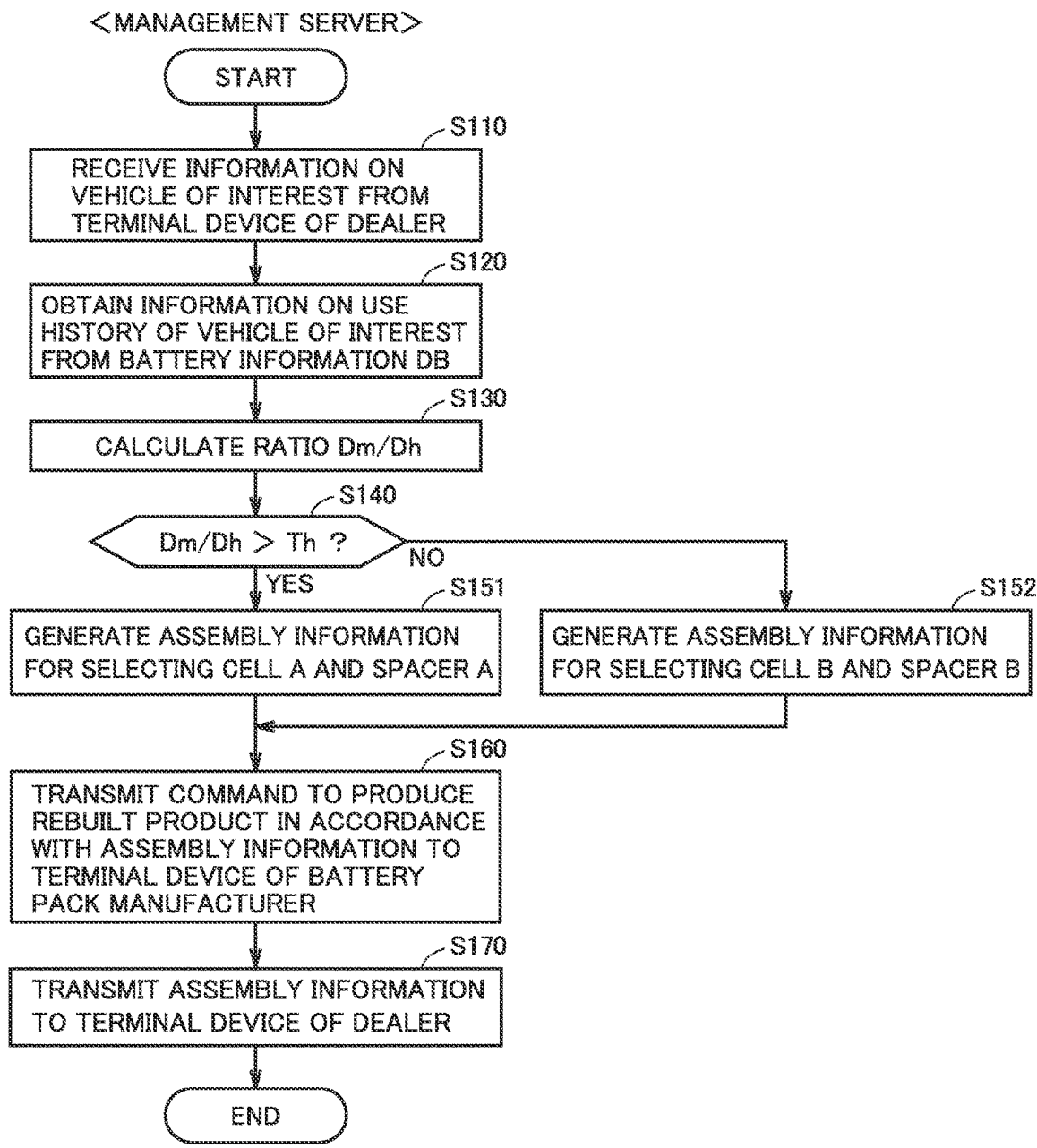
FIG. 10 is a flowchart illustrating a procedure of processing performed by a management server in the battery manufacturing system according to the first embodiment.

FIG. 10 is a flowchart illustrating a procedure of processing performed by management server 20. Processing shown in the flowchart is performed when information for identifying vehicle 10 (vehicle of interest) of which battery assembly 100 is to be replaced is received from terminal device 45 of dealer 35.

Referring to FIG. 10, management server 20 (information processing apparatus 21) receives information on a vehicle of interest (vehicle 10) from terminal device 45 of dealer 35 (step S110). Then, management server 20 obtains information on a use history of battery assembly 100 of the vehicle of interest (vehicle 10) (the Dh relevant information and the Dm relevant information) from battery information DB 24 (step S120). Management server 20 obtains the information on the use history of battery assembly 100 of the vehicle of interest (vehicle 10) identified by the information received from terminal device 45 of dealer 35 from battery information DB 24.

Then, management server 20 calculates ratio Dm/Dh (a ratio of an amount of material deterioration to an amount of high-rate deterioration) by using the information on the use history (the Dh relevant information and the Dm relevant information) of battery assembly 100 of vehicle 10 obtained from battery information DB 24 and correspondence information in battery information DB 24 (step S130). Specifically, management server 20 initially finds Dh and Dm and obtains ratio Dm/Dh by dividing Dm by Dh. How to find Dh and Dm will be described below in detail.

Initially, how to find an amount of high-rate deterioration (Dh) will be described. Evaluation value D can be expressed in an expression (1) shown below:

$$D(N)=D(N-1)-D(-)+D(+) \qquad (1)$$

where N represents a natural number not smaller than two, D(N) represents a present (Nth) evaluation value D, and D(N−1) represents a previous ((N−1)th) evaluation value D. Present evaluation value D can be found from previous evaluation value D. Since an ion concentration is not uneven in the initial state, a condition of "D(1)=0" is satisfied. A cycle time corresponding to a time elapsed since the (N−1)th period until the Nth period is denoted as Δt below.

In the expression (1), D(−) and D(+) can be expressed in expressions (2) and (3), respectively.

$$D(-)=A \times \Delta t \times D(N-1) \qquad (2)$$

$$D(+)=(B/C) \times I \times \Delta t \qquad (3)$$

In the expression (2), A represents a forgetting factor. In the expression (3), B represents a current coefficient, C represents a limit value, and I represents an amount of discharging current of battery assembly 100. The forgetting factor (A) is set to satisfy relation of "0<A×Δt<1". An amount of discharging current (I) has a positive value (I>0) during discharging and has a negative value (I<0) during charging.

In the expression (2), "D(−)" is a term in which D(N) is varied toward 0, and represents an amount of lessening (rectification) of unevenness in jail concentration owing to diffusion of ions during cycle time Δt. As "A×Δt" is greater (closer to 1), an evaluation value D(N) varies faster toward 0.

In the expression (3), "D(+)" represents increase in unevenness in ion concentration. As is understood from the expression (3), during discharging, as an amount of a current (an absolute value of I) is greater or cycle time Δt is longer, an evaluation value D(N) varies in a positive (+) direction. During charging, as an amount of a current (an absolute value of I) is greater or cycle time Δt is longer, an evaluation value D(N) varies in a negative (−) direction. D(N) having a positive value (D(N)>0) indicates that an ion concentration is uneven on a discharging side and D(N) having a negative value (D(N)<0) indicates that an ion concentration is uneven on a charging side.

Management server 20 can calculate an evaluation value D(N) by finding a forgetting factor (A), a current coefficient (B), a limit value (C), an amount of discharging current (I), and a cycle time (Δt) of a vehicle of interest (vehicle 10) by using the Dh relevant information obtained in step S120 and substituting them into the expressions (1) to (3). The forgetting factor (A) can be found from a temperature and an SOC of battery assembly 100 obtained in step S120 by referring to the SOC-T-A correspondence information in battery information DB 24. The current coefficient (B) can be obtained from battery information DB 24 because it is stored in advance in battery information DB 24. The limit value (C) can be found from a temperature and an SOC of battery assembly 100 obtained in step S120 by referring to the SOC-T-C correspondence information in battery information DB 24. The Dh relevant information (a current value and a cycle time) obtained in step S120 can be used as it is as an amount of discharging current (I) and a cycle time (Δt).

Management server 20 can find a ΣD value in accordance with an expression (4) shown below. For example, management server 20 finds a ΣD value by integrating all evaluation values D obtained since an initial stage.

$$\Sigma D(N) = \Sigma D(N-1) + D(N) \quad (4)$$

Figure 11:
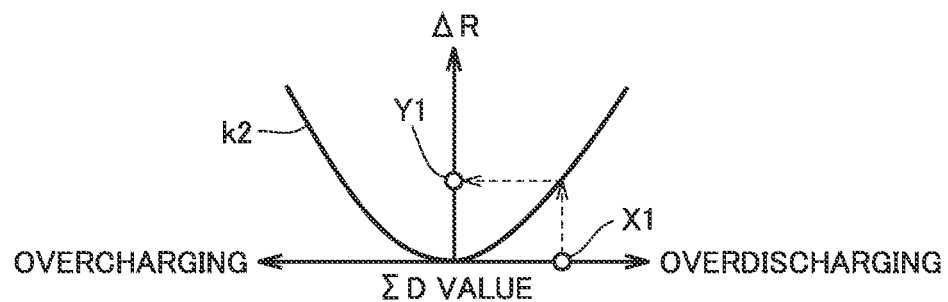
FIG. 11 is a diagram showing one example of ΣD value-Dh correspondence information for finding an amount of high-rate deterioration (Dh).

Management server 20 then finds an amount of high-rate deterioration (Dh) from the obtained ΣD value. Management server 20 can find Dh from the ΣD value by referring to the ΣD value-Dh correspondence information in battery information DB 24. FIG. 11 shows one example of the ΣD value-Dh correspondence information. In FIG. 11, a rate of increase in resistance is adopted as a parameter representing an amount of high-rate deterioration (Dh).

Referring to FIG. 11, the abscissa represents a ΣD value of battery assembly 100 and the ordinate represents a rate of increase in resistance (ΔR). The rate of increase in resistance is a parameter representing an amount of increase in resistance of a cell, and specifically represents how much a value of an internal resistance of a deteriorated cell has increased from a value of an internal resistance of the cell in an initial state. A solid line k2 represents relation between a ΣD value and a rate of increase in resistance (ΔR). It can be estimated from solid line k2 that a rate of increase in resistance (ΔR) is at Y1, for example, when a ΣD value is at X1.

One example of how to find an amount of high-rate deterioration (Dh) is described above. An evaluation value D may be calculated with any method so long as it is calculated to quantitatively show how uneven an ion concentration is in an electrolyte. For example, an evaluation value D when an ion concentration is uneven on a discharging side and an evaluation value D when an ion concentration is uneven on a charging side may be calculated in mathematical expressions different from each other. Alternatively, D(N) may be integrated while ΣD(N−1) in the expression (4) is corrected with a correction coefficient (a relaxation coefficient) for reflecting relaxation of high-rate deterioration with lapse of time.

Figure 12:
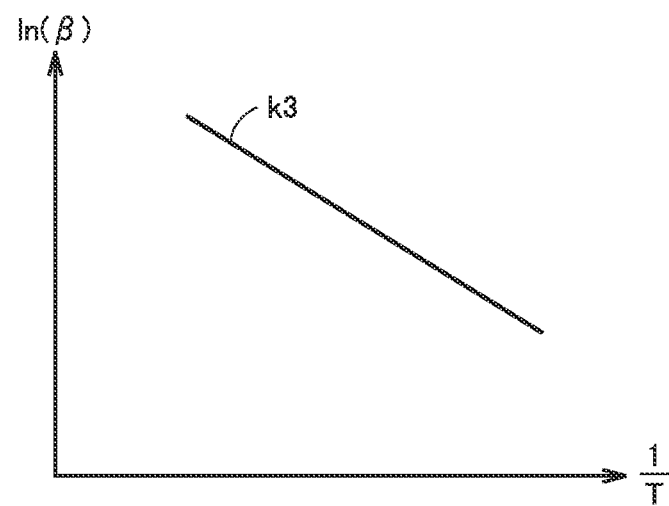
FIG. 12 is a diagram showing one example of T-β correspondence it for finding an amount of material deterioration (Dm).

How to find an amount of material deterioration (Dm) will no be described. An amount of material deterioration (Dm) can be found from a temperature of battery assembly 100 obtained in step S120 (for example, a temperature frequency distribution of battery assembly 100 as shown in FIG. 9) and a rate of deterioration (β). Specifically, an amount of increase in resistance from the initial state can be found by multiplying a frequency in the temperature frequency distribution of battery assembly 100 by a rate of deterioration (β). Management server 20 can obtain, for example, a value of an internal resistance of a cell in the initial state from battery information DB 24, and find a rate of increase in resistance from a value of the internal resistance of the cell in the initial state, the temperature frequency distribution obtained in step S120, and the rate of deterioration (β). The rate of deterioration (β) varies with a temperature of battery assembly 100. Therefore, management server 20 finds a rate of deterioration (β) at each temperature by referring to the T-β correspondence information in battery information DB 24. FIG. 12 shows one example of the T-β correspondence information.

Referring to FIG. 12, the abscissa represents a reciprocal (1/T) of a temperature of battery assembly 100 and the ordinate represents a natural logarithmic value (ln(β)) of a rate of deterioration. A solid line k3 defines relation between a temperature (T) of battery assembly 100 and a rate of deterioration (β), and specifically defines such relation that a rate of deterioration (β) is higher as a temperature (T) of battery assembly 100 is higher. A rate of deterioration (β) at each temperature is obtained from solid line k3. With temperature dependency under the Arrhenius law, as shown with solid line k3, 1/T and ln(β) often satisfy substantially proportional relation.

One example of how to find an amount of material deterioration (Dm) is described above, An amount of material deterioration (Dm) may be calculated by any method so long as it is calculated to quantitatively represent a degree of deterioration of a material for a cell under the influence by heat. For example, an amount of material deterioration (Dm) may be found by using a peak frequency in a temperature frequency distribution shown in FIG. 9. An amount of material deterioration (Dm) can be found by multiplying a peak frequency in the temperature frequency distribution, a rate of deterioration (β) at a peak temperature, and a correction coefficient found in advance through experiments by one another.

In the example above, a rate of increase in resistance is adopted as a parameter representing each of an amount of high-rate deterioration (Dh) and an amount of material deterioration (Dm). Without being limited thereto, however, an amount of increase in resistance from the initial state can also be adopted as a parameter representing each of Dh and Dm.

Referring again to FIG. 10, management server 20 calculates ratio Dm/Dh by finding Dh and Dm as above and dividing Dm by Dh (step S130). Then, management server 20 determines which of a combination of a cell A and a spacer A and a combination of a cell B and a spacer B is suited for manufacturing (rebuilding) a battery based on ratio Dm/Dh (step S140). Either combination is selected in steps S151 and S152, and assembly information for rebuilding with the selected cell and spacer is generated.

FIG. 13 is a diagram showing a replacement cell (cells A and B) selected in steps S151 and S152. Cell A is a replacement cell which satisfies a requirement of a BET specific surface area of a negative electrode being "small" and a weight per unit area of the negative electrode being "light". Cell B is a replacement cell which satisfies a requirement of a BET specific surface area of the negative electrode being "large" and a weight per unit area of the negative electrode being "heavy". Cell B is larger in BET specific surface area of the negative electrode than cell A. Any numeric range of the BET specific surface area of the negative electrode of each cell can be set so long as this relation is satisfied. Cell B is heavier in weight per unit area of the negative electrode than cell A. Any numeric range of the weight per unit area of the negative electrode of each cell can be set so long as this relation is satisfied. For example, a lithium ion battery is adopted as each of cells A and B.

How a cell deteriorates is different depending on a material or a structure of the cell. The inventor of the present application has noted a BET specific surface area and a weight per unit area of a negative electrode as a material and a structure of a cell which greatly affect high-rate deterioration. Specifically, in a non-aqueous electrolyte secondary battery, in many cases, a positive electrode active material layer is composed of a relatively hard material (for example, a metal oxide) and a negative electrode active material layer is composed of a relatively soft material (for example, a carbon based material). Therefore, a negative electrode plate of the non-aqueous electrolyte secondary battery is often softer than a positive electrode plate. During charging of the secondary battery, the electrode assembly expands. For example, referring to FIG. 7, during charging of cell 110, electrode assembly 114 expands. Electrode assembly 114 which expands in case 115 comes in contact with an inner wall of case 115 and presses case 115 outward. Outside of case 115, protrusion 121 of spacer 120 presses main surface F1 of cell 110 toward the inside of case 115. As deformation of case 115 is suppressed by pressing by protrusion 121, stress is applied to electrode assembly 114 (in particular, soft negative electrode plate 112) within case 115. Expansion and contraction of electrode assembly 114 is more significant as a charging and discharging rate is higher. Therefore, with repeated charging and discharging at a high rate, the electrolyte held in the negative electrode active material layer in negative electrode plate 112 is pressed out and an internal resistance in cell 110 tends to increase. The inventor of the present application has experimentally found that an amount of high-rate deterioration of cell 110 decreases by increasing a BET specific surface area of negative electrode plate H 2. The inventor of the present application has experimentally found that an amount of high-rate deterioration of cell 110 decreases by increasing a weight per unit area of negative electrode plate 112. This may be because, as negative electrode plate 112 is larger in BET specific surface area or weight per unit area, negative electrode plate 112 is more likely to hold the electrolyte.

As described above, in FIG. 13, cell A is higher in resistance against deterioration of a material than resistance against high-rate deterioration. Cell B is higher in resistance against high-rate deterioration than resistance against material deterioration. Therefore, cell A falls under a cell highly resistant against material deterioration and cell B falls under a cell highly resistant against high-rate deterioration.

For cells A and B, a numeric range of each of a BET specific surface area and a weight per unit area of the negative electrode is set within a range of process variation of the cell. Without significant variation in characteristics of battery assembly 100 due to rebuilding, a rebuilt product can appropriately be operated without modifying a peripheral circuit of battery assembly 100. It is expected that, by recycling a battery assembly identical in specifications to battery assembly 100, inventories of replacement cells falling under cells A and B are more readily ensured.

For example, a numeric range of a weight per unit area of the negative electrode may be set to a range not smaller than "the lower limit value of process variation" and smaller than a "median value of process variation" for cell A and to a range not smaller than the "median value of process variation" and not greater than the "upper limit value of process variation" for cell B. If the lower limit value, the median value, and the upper limit value of process variation in connection with the weight per unit area of the negative electrode are assumed as 10, 20, and 30, respectively, the numeric range of the weight per unit area of the negative electrode of each cell is set within a range of process variation of the cell by setting a numeric range for cell A to be "not smaller than 10 and smaller than 20" and setting a numeric range for cell B to be "not smaller than 20 and not greater than 30." Description about the numeric range of the weight per unit area of the negative electrode is also applicable to a numeric range of the BET specific surface area of the negative electrode.

FIG. 14 is a diagram showing a replacement spacer (spacers A and B) selected in steps S151 and S152 in FIG. 10. Each of spacers A and B includes a plate-shaped main body and a protrusion protruding from the main body toward a cell. Spacer A of spacers A and B is a replacement spacer which satisfies a requirement of an area of contact between the protrusion and a cell being "large" and spacer B is a replacement spacer which satisfies a requirement of an area of contact between the protrusion and a cell being "small". Spacer A is greater in area of contact between the protrusion and the cell than spacer B. Any numeric range of an area of contact of each spacer can be set so long as this relation is satisfied. For example, an area of contact between the protrusion of spacer A and the cell is at least twice as large as an area of contact between the protrusion of spacer B and the cell.

How a cell deteriorates is different depending on a material or a structure of a spacer. The inventor of the present application has noted a shape of a protrusion of a spacer as a structure of the spacer which particularly greatly affects high-rate deterioration. An area of contact between the protrusion of the spacer and the cell varies depending on a shape of the protrusion of the spacer.

Figure 15:
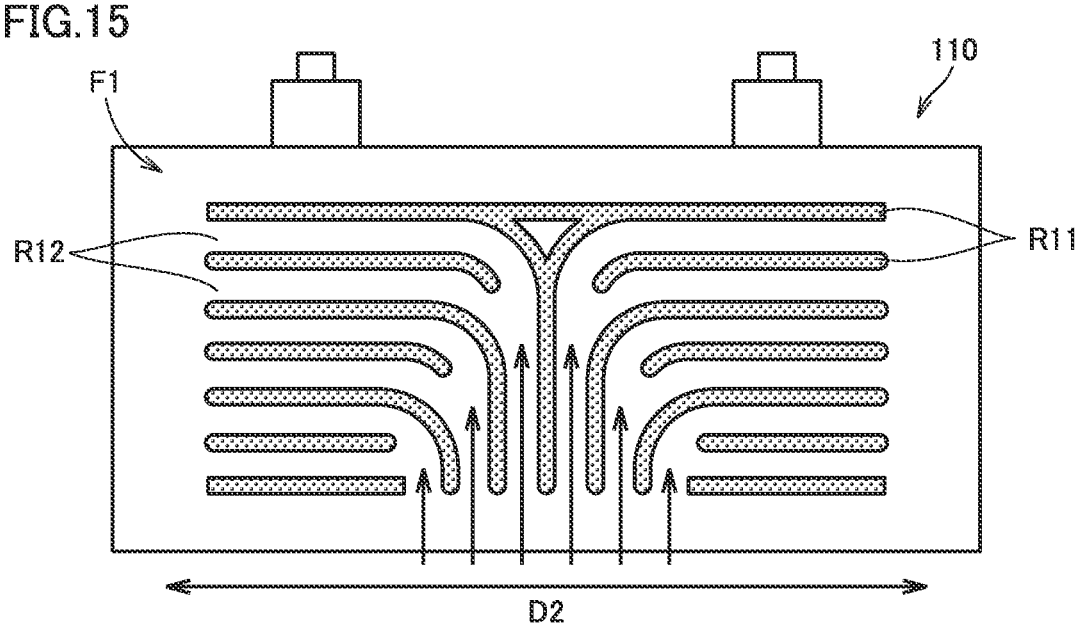
FIG. 15 is a diagram showing a main surface of a cell of a battery assembly manufactured with spacer A.

FIG. 15 shows a region R11 in which the protrusion of spacer A is in contact and a region R12 in which the protrusion of spacer A is not in contact in main surface F1 (a surface of the battery case) of cell 110 when spacer A is used.

Referring to FIG. 15, region R11 corresponds to a two-dimensional shape of the protrusion of spacer A (a shape when viewed in direction of alignment D1 in FIG. 5). The protrusions of spacer A (region R11) are formed like teeth of a comb and a coolant flow path is defined between teeth of the comb (region R12). Coolant is fed, for example, in a direction shown with an arrow in FIG. 15. Protrusions like teeth of a comb are arranged over the entire cell 110. Therefore, when spacer A is used, cell 110 is restrained as a whole. With such restraint, even though electrode assembly 114 expands during charging of cell 110, case 115 is less likely to deform. In the example in FIG. 15, an area of contact between the protrusions of spacer A and main surface F1 of cell 110 (a total area of region R11) is approximately 1500 cm$^2$.

Figure 16:
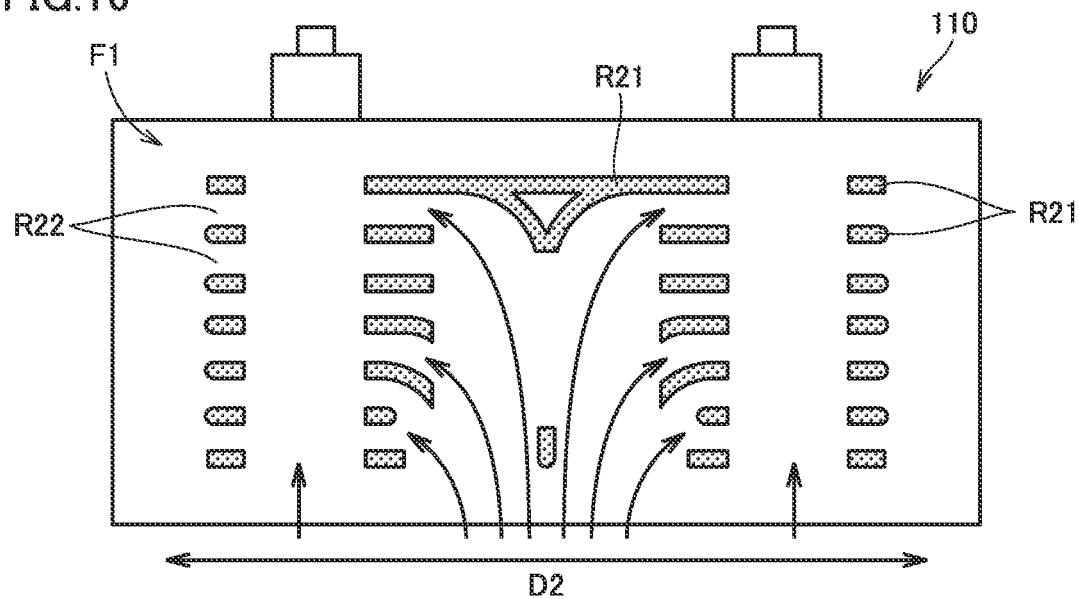
FIG. 16 is a diagram showing a main surface of a cell of a battery assembly manufactured with spacer B.

FIG. 16 shows a region R21 with in the protrusion of spacer B is in contact and a region R22 in which the protrusion of spacer B is not in contact in main surface F1 (a surface of the battery case) of cell 110 when spacer B is used.

Referring to FIG. 16, region R21 corresponds to a two-dimensional shape of the protrusion of spacer B (a shape when viewed in direction of alignment D1 in FIG. 5). The protrusions of spacer B (region R21) are formed like teeth of a comb and a coolant flow path is defined between teeth of the comb (region R22). Coolant is fed, for example, in a direction shown with an arrow in FIG. 16. Spacer B is smaller in number of protrusions than spacer A. The protrusions of spacer B are not in contact with three large regions (an end on a positive electrode side, a central portion, and an end on a negative electrode side) aligned in direction of width D2 in main surface F1 of cell 110. Therefore, when spacer B is employed, cell 110 is only partially restrained. When electrode assembly 114 expands during charging of cell 110, the three large regions are not pressed by spacer B. Deformation of case 115 is thus allowed to some extent. In the presence of a large region with which the protrusion of spacer B is not in contact in main surface F1 of cell 110, expansion of electrode assembly 114 is allowed. In the example in FIG. 16, an area of contact between the protrusions of spacer B and main surface F1 of cell 110 (a total area of region R21) is approximately 750 cm².

The inventor of the present application has experimentally found that an amount of high-rate deterioration of cell 110 becomes smaller by making an area of contact between protrusion 121 of spacer 120 and cell 110 smaller. This may be because application of stress to electrode assembly 114 (negative electrode plate 112 and the like) in case 115 is less likely since deformation of case 115 is allowed.

Figure 17:
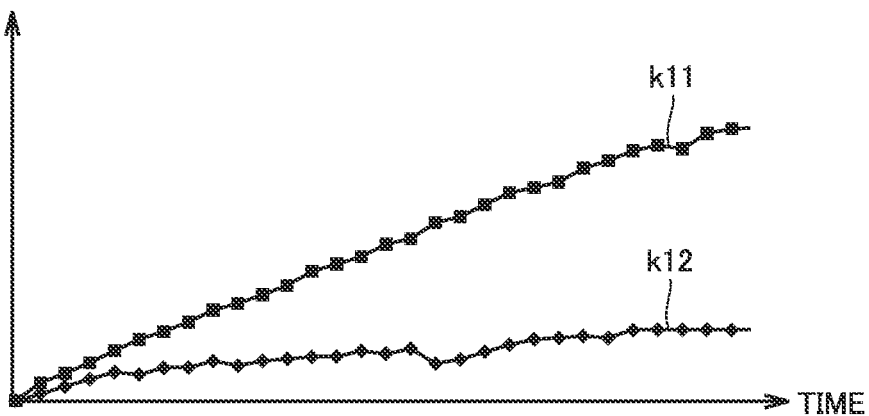
FIG. 17 is a diagram showing a result of measurement of an amount of high-rate deterioration (Dh) for each of a battery assembly including spacer A and a battery assembly including spacer B.
Figure 18:
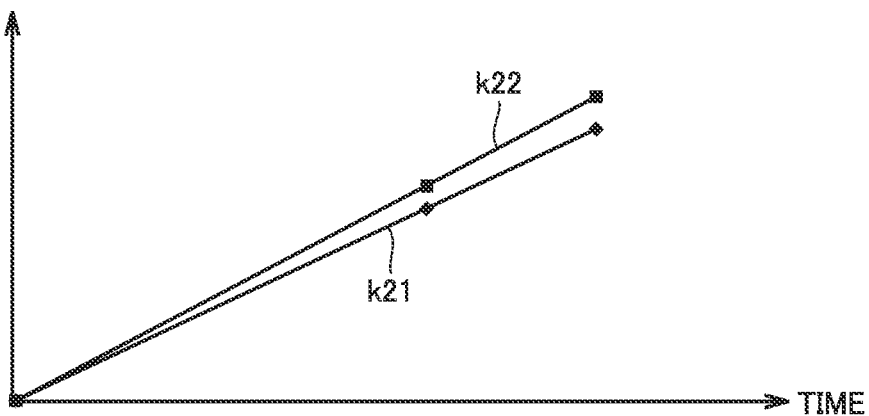
FIG. 18 is a diagram showing a result of measurement of an amount of material deterioration (Dm) for each of a battery assembly including spacer A and a battery assembly including spacer B.

FIGS. 17 and 18 show results of measurement of an amount of high-rate deterioration (Dh) and an amount of material deterioration (Dm) for each of a battery assembly including spacer A shown in FIG. 15 (which is referred to as a "battery assembly A" below) and a battery assembly including spacer B shown in FIG. 16 (which is referred to as a "battery assembly B" below).

Referring to FIG. 17, the abscissa represents time and the ordinate represents a rate of increase in resistance. A solid line k11 represents transition of a rate of increase in resistance when charging and discharging of battery assembly A is repeated under such a condition that high-rate deterioration due to overcharging is likely to occur in a room temperature environment. A solid line k12 represents transition of a rate of increase in resistance when charging and discharging of battery assembly B is repeated under the same condition in the same environment. A high rate of increase in resistance in FIG. 17 means a large amount of high-rate deterioration. By repeating charging of battery assemblies A and B at a high rate, high-rate deterioration of the cell progressed and an internal resistance of the cell increased over time. It is understood from solid line k11 that an amount of high-rate deterioration of battery assembly A is large. It is understood from solid line k12 that an amount of high-rate deterioration of battery assembly B is small. It is understood from solid lines k11 and k12 that battery assembly B is higher in resistance against high-rate deterioration of the cell than battery assembly A.

Referring to FIG. 18, the abscissa represents time and the ordinate represents a rate of increase in resistance. A solid line k21 represents transition of a rate of increase in resistance when battery assembly A is placed for a long period of time in a high-temperature environment while charging and discharging with such a low current as not causing high-rate deterioration is repeated. A solid line k22 represents transition of a rate of increase in resistance when battery assembly B is placed in the same environment for a long period of time while charging and discharging is repeated under the same condition. A temperature in the environment was set to such a temperature as gradually deteriorating a material for the cell under the influence by heat. A high rate of increase in resistance in FIG. 18 means a large amount of material deterioration. By placing battery assemblies A and B for a long period of time in a high-temperature environment, the material for the cell has deteriorated under the influence by heat. An internal resistance of the cell increased over time. Based on comparison of an amount of material deterioration of battery assembly A (solid line k21) with an amount of material deterioration of battery assembly B (solid line k22), battery assembly B is larger in amount of material deterioration than battery assembly A. It is understood from solid lines k21 and k22 that battery assembly A is higher in resistance against material deterioration of a cell than battery assembly B.

As described above, in FIG. 14, spacer A is higher in resistance against material deterioration of a cell than resistance against high-rate deterioration of the cell. Spacer B is higher in resistance against high-rate deterioration of the cell than resistance against material deterioration of the cell. Therefore, spacer A falls under a spacer highly resistant against material deterioration and spacer B falls under a spacer highly resistant against high-rate deterioration.

Referring again to FIG. 10, in step S140, management server 20 determines whether or not ratio Dm/Dh obtained in step S130 is higher than a threshold value Th. Any numeric value can be set as threshold value Th. For example, threshold value Th is set to "1". Threshold value Th may simply be denoted as "Th" below.

When Dm is greater than Dh, it is determined that ratio Dm/Dh is greater than Th (=1) (YES in step S140). In this case, management server 20 generates assembly information for rebuilding with cell A and spacer A (a cell highly resistant against material deterioration and a spacer highly resistant against material deterioration) shown in FIGS. 13 and 14 (step S151). Specifically, assembly information indicating a cell and a spacer to be used for manufacturing (for example, rebuilding) a battery assembly is generated as a result of selection of cell A and spacer A on a priority basis. Management server 20 selects cells to be used for rebuilding in number necessary for production of a rebuilt product by referring to recycled product DB 23 in which information on recyclable cells (replacement cells) is stored. Cells falling under cell A are preferentially selected. In some embodiments, only cells falling under cell A are selected. When inventories of cells (replacement cells) falling under cell A are insufficient, management server 20 selects other cells under prescribed criteria by referring to recycled product DB 23. Spacer A is selected as a spacer to be used for rebuilding. A new product or a secondhand product (a recycled product) may be used for spacer A. In step S151, assembly information indicating selection of cell A and spacer A (first assembly information) is thus generated. In manufacturing a battery assembly based on such first assembly information, cell A and spacer A are mainly selected as a cell and a spacer to be used for manufacturing a battery assembly.

When Dm is not greater than Dh, ratio Dm/Dh is determined as not being greater than Th (=1) (NO in step S140). In this case, management server 20 generates assembly information for rebuilding with cell B and spacer B (a cell highly resistant against high-rate deterioration and a spacer highly resistant against high-rate deterioration) shown in FIGS. 13 and 14 (step S152). Specifically, assembly information indicating a cell and a spacer to be used for manufacturing (for example, rebuilding) a battery assembly is generated as a result of selection of cell B and spacer B on a priority basis. Management server 20 selects cells to be used for rebuilding in number necessary for production of a rebuilt product by referring to recycled product DB 23 in which information on recyclable cells (replacement cells) is stored. Cells falling under cell B are preferentially selected. In some embodiments, only cells falling under cell B are selected. When inventories of cells (replacement cells) falling under cell B are insufficient, management server 20 selects other cells under prescribed criteria by referring to recycled product DB 23. Spacer B is selected as a spacer to be used for rebuilding. A new product or a secondhand product (a recycled product) may be used for spacer B. In step S152, assembly information indicating selection of cell B and spacer B (second assembly information) is thus generated. In manufacturing a battery assembly based on such second assembly information, cell B and spacer B are mainly selected as a cell and a spacer to be used for manufacturing a battery assembly.

In each of steps S151 and S152, for example, assembly information can be generated by referring to traceability data (a BET specific surface area of a negative electrode and a weight per unit area of a negative electrode in the initial stage) of a cell stored in recycled product DB 23. Without being limited thereto, assembly information may be generated by referring to information on a used cell (a BET specific surface area of a negative electrode and a weight per unit area of a negative electrode measured after use).

In a system in which a new spacer is used for rebuilding, spacer A or B selected based on the assembly information is prepared by battery pack manufacturer 34. In a system in which a used product is used not only for a cell but also for a spacer, a secondhand spacer is managed similarly to a secondhand cell. For example, information on a recyclable spacer (a replacement spacer) is accumulated in recycled product DB 23 in association with an ID (an identification sign) for identifying each spacer. In a spacer in which protrusion 121 is provided as being attachable to and detachable from main body 122, an area of contact between protrusion 121 of spacer 120 and cell 110 may be varied by attaching and detaching protrusion 121.

When assembly information is generated in any of steps S151 and S152, management server 20 transmits a command to produce a rebuilt product in accordance with the generated assembly information to terminal device 44 of battery pack manufacturer 34 (step S160). Battery pack manufacturer 34 thus manufactures a rebuilt product of battery assembly 100 to be mounted on vehicle 10. A rebuilt product in accordance with such assembly information has characteristics suited to a user of vehicle 10. Management server 20 further transmits the generated assembly information to terminal device 45 of dealer 35 to which vehicle 10 has been brought (step S170).

A cell and a spacer may be replaced at an timing, and may be replaced, for example, at the timing of periodic maintenance. Management server 20 may find appropriate timing of replacement based on information on a use history of battery assembly 100 (for example, the number of times of charging of battery assembly 100 and a distance of travel of vehicle 10) and notify a user of the timing when that timing comes.

As set forth above, in battery management system 1 according to the first embodiment, management server 20 (a material deterioration amount calculator and a high-rate deterioration amount calculator) calculates an amount of material deterioration (Dm) and an amount of high-rate deterioration (Dh) based on information on a use history of battery assembly 100 used in vehicle 10 (step S130). Then, management server 20 (an assembly information generator) generates assembly information (any one of first assembly information and second assembly information) for selecting a cell and a spacer to be used for manufacturing a battery assembly by using an amount of material deterioration (Dm) and an amount of high-rate deterioration (Dh). Specifically, when ratio Dm/Dh is higher than threshold value Th, assembly information (first assembly information) indicating selection of a cell highly resistant against material deterioration and a spacer highly resistant against material deterioration (cell A and spacer A) is generated in step S151. When ratio Dm/Dh is lower than threshold value Th, assembly information (second assembly information) indicating selection of a cell highly resistant against high-rate deterioration and a spacer highly resistant against high-rate deterioration (cell B and spacer B) is generated in step S152. Battery pack manufacturer 34 then manufactures a rebuilt product in accordance with the assembly information.

By producing a rebuilt product as set forth above, battery assembly 100 can be rebuilt (manufactured) by using a cell and a spacer suited to usage of vehicle 10 by a user. Specifically, a rebuilt product highly resistant against high-rate deterioration of a cell can be provided to a user who uses battery assembly 100 in such a manner that high-rate deterioration of a cell gives rise to a problem. High-rate deterioration of a cell can thus be suppressed and battery assembly 100 can have a longer lifetime. A rebuilt product highly resistant against deterioration of a material for a cell can be provided to a user who uses a vehicle in such a mummer that high-rate deterioration does not give rise to a problem. Material deterioration of a cell can thus be suppressed and battery assembly 100 can have a longer lifetime.

FIG. 19 is a diagram showing a result of evaluation of a rate of increase in resistance after traveling and output after long-term use of a rebuilt product according to an Example and a rebuilt product according to a Comparative Example.

A battery manufacturing system according to the Example performs processing in FIG. 8 and processing in FIG. 10 described previously. In the processing in FIG. 10, threshold value Th is set to "1". For cells A and B (FIG. 13), a numeric range of each of a BET specific surface area of a negative electrode and a weight per unit area of the negative electrode is set within a range of process variation of each cell.

The battery manufacturing system according to the Comparative Example is different from the battery manufacturing system according to the Example only in that spacer A is selected and a cell is not designated in both of steps S151 and S152 in FIG. 10.

In each of the Example and the Comparative Example, a battery assembly which satisfies a condition of "Dh>Dm" is to be rebuilt. Since ratio Dm/Dh of a battery assembly to be rebuilt is lower than threshold value Th (=1), in the battery manufacturing system according to the Example, assembly information for rebuilding with cell B and spacer B (see FIGS. 13, 14, and 16) is generated in step S152. In the battery manufacturing system according to the Comparative Example, in step S152, assembly information for rebuilding with spacer A (see FIGS. 14 and 15) is generated. In this assembly information, no cell is designated.

A rebuilt product in accordance with the assembly information generated in each of the Example and the Comparative Example is produced. In the Comparative Example, a cell to be used for rebuilding is randomly selected. A rate of increase in resistance after traveling and output after long-term use are evaluated for each rebuilt product. In evaluation of a rate of increase in resistance of a rebuilt product (battery assembly), a vehicle incorporating the rebuilt product is subjected to a traveling test, and a rate of increase in value of an internal resistance of the rebuilt cell after traveling test from a value of the internal resistance of the rebuilt cell before the traveling test is determined. In evaluation of output from the rebuilt product (battery assembly), the rebuilt product is used for a long period of time (a prescribed period) as being mounted on a vehicle and thereafter output from the rebuilt product is measured.

Referring to FIG. 19, in evaluation of both of the rate of increase in resistance and the output, the rebuilt product according to the Example was better than the rebuilt product according to the Comparative Example. Specifically, the rate of increase in resistance (106.4%) of the rebuilt product according to the Example is lower than the rate of increase in resistance (123.5%) of the rebuilt product according to the Comparative Example. It is understood from the result that the rebuilt product according to the Example is longer in lifetime than the rebuilt product according to the Comparative Example. Output (469 W) from the rebuilt product according to the Example is higher than output (404 W) from the rebuilt product according to the Comparative Example. It is understood from the result that the rebuilt product according to the Example is higher in capability to maintain motive power performance than the rebuilt product according to the Comparative Example.

Battery management system 1 according to the first embodiment generates assembly information for selecting not only a cell but also a spacer. Therefore, even though inventories of cells suited to usage by a user are insufficient, at least a spacer can be replaced with a spacer suited to the usage by the user. A spacer is less likely to suffer from material deterioration than a cell. Properties of a spacer are stable and less likely to alter. Therefore, inventories of spacers can relatively readily be secured.

When Th is set to 1 in step S140 in FIG. 10, "Dm/Dh>1" is the same in meaning as "Dm>Dh". Therefore, when Th is set to 1, ratio Dm/Dh does not have to be calculated so long as Dm and Dh are calculated in step S130 in FIG. 10. Therefore, in step S130 in FIG. 10, Dm and Dh may be calculated, and whether or not a condition of "Dm>Dh" is satisfied may be determined in step S140. Th may arbitrarily be set without being limited to 1. For example, by setting Th to 0.5, a cell and a spacer highly resistant against deterioration of a material for a cell (a cell highly resistant against material deterioration and a spacer highly resistant against material deterioration) tend to be selected. By setting Th to 1.5, a cell and a spacer highly resistant against high-rate deterioration of a cell (a cell highly resistant against high-rate deterioration and a spacer highly resistant against high-rate deterioration) tend to be selected.

When ratio Dm/Dh and Th are equal to each other in step S140 in FIG. 10, determination as NO is made and the process proceeds to step S152. Without being limited thereto, step S140 may be modified such that, when ratio Dm/Dh and Th are equal to each other, determination as YES is made and the process proceeds to step S151.

In the embodiment, a weight per unit area of a negative electrode of a cell and a BET specific surface area of the negative electrode of the cell are adopted as indicators indicating which of high-rate deterioration of a cell and a material deterioration of a cell is relatively more likely to occur when the cell is incorporated in a battery assembly (FIG. 13). Specifically, a cell of which weight per unit area of the negative electrode is smaller than a prescribed value and of which BET specific surface area of the negative electrode is smaller than a prescribed value is determined as being higher in resistance against deterioration of a material than resistance against high-rate deterioration. Without being limited thereto, only any one of a BET specific surface area of a negative electrode and a weight per unit area of the negative electrode may be adopted as the indicator.

For example, a replacement cell (cells A and B) categorized only based on a weight per unit area of a negative electrode of a cell as shown in FIG. 20 may be used for rebuilding. In FIG. 20, cell A falls under a cell highly resistant against material deterioration and cell B falls under a cell highly resistant against high-rate deterioration.

In the embodiment, information on a use history of battery assembly 100 is collected by management server 20, and management server 20 calculates ratio Dm/Dh and generates assembly information based on calculated ratio Dm/Dh. Vehicle 10, however, may calculate ratio Dm/Dh and management server 20 may obtain ratio Dm/Dh from vehicle 10 and generate assembly information. Alternatively, vehicle 10 may perform steps until making determination as to whether or not ratio Dm/Dh is higher than threshold value Th (for example, step S140) and management server 20 may obtain a result of determination from vehicle 10.

In the embodiment, information on a use history of battery assembly 100 of vehicle 10 is collected by management server 20, and management server 20 generates assembly information for manufacturing battery assembly 100. Without using management server 20, however, for example, information on a use history of battery assembly 100 may be accumulated in vehicle 10, and terminal device 44 of battery pack manufacturer 34 or terminal device 45 of dealer 35 may generate assembly information.

Information on a use history of battery assembly 100 may be accumulated in vehicle 10, vehicle 10 may be connected to terminal device 45 of dealer 35 when vehicle 10 is brought to dealer 35, and terminal device 45 may transmit the information on the use history of battery assembly 100 accumulated in vehicle 10 to management server 20.

In the embodiment, vehicle 10 transmits information on a use history (Dh relevant information and Dm relevant information) to management server 20, and management server 20 finds ratio Dm/Dh based on the use history information. Without being limited thereto, vehicle 10 may calculate ratio Dm/Dh and calculated ratio Dm/Dh may be transmitted to management server 20.

Second Embodiment

In the first embodiment, information on a battery assembly mounted on a vehicle of interest (vehicle 10) is collected and a battery assembly for the vehicle of interest (vehicle 10) is rebuilt based on the collected information.

In a second embodiment, information on battery assemblies is collected by the management server from a plurality of vehicles each incorporating battery assemblies, and a battery assembly is newly manufactured based on the collected information (big data).

FIG. 21 is a diagram schematically showing an overall configuration of a battery management system 1A according to the second embodiment. Since battery management system 1A according to the second embodiment is mostly in common in configuration to battery management system 1 according to the first embodiment, differences from battery management system 1 will mainly be described and description of components in common not be provided.

Referring to FIG. 21, battery management system 1A includes a plurality of vehicles 10-1, 10-2, 10-3, . . . , a management server 20A, and communication network 50. Each of vehicles 10-1, 10-2, 10-3, . . . include battery assemblies. Management server 20A includes an information processing apparatus 21A, communication device 22, and a battery information DB 24A.

Battery management system 1A newly manufactures battery assemblies and does not use a secondhand product (a recycled product). Therefore, management server 20A does not include a recycled product DB.

Overview of operations by battery management system 1A will be described below with reference to FIGS. 1 and 2 together with FIG. 21. Battery management system 1A includes management server 20A (FIG. 21) instead of management server 20 (FIGS. 1 and 2). Vehicle 10 shown in FIGS. 1 and 2 is one of vehicles 10-1, 10-2, 10-3, . . . shown in FIG. 21. For example, when a user who is considering purchase of a new car (replacement purchase of vehicle 10) brings currently used vehicle 10 (vehicle of interest) to dealer 35 (FIG. 1), information for identifying vehicle 10 is transmitted from terminal device 45 (FIG. 2) of dealer 35 to management server 20A. Management server 20A reads information on a use history of a battery assembly of vehicle 10 (information received from vehicle 10) from battery information DB 24A. The use history information includes at least one of an environment of use of a battery assembly mounted on vehicle 10, a condition for traveling of vehicle 10, a time period of traveling of vehicle 10, and a frequency of traveling of vehicle 10. Management server 20A generates assembly information for manufacturing a battery assembly based on whether or not the information on the use history of the battery assembly of vehicle 10 satisfies a prescribed condition. A condition that high-rate deterioration of a cell is less likely to occur and/or a condition that deterioration of a material for a cell is likely to occur are/is adopted as the prescribed condition.

When a user desires a new car, battery pack manufacturer 34 (FIG. 1) manufactures a battery assembly to be mounted on a new car with a cell and a spacer based on the assembly information. When the user desires replacement of a battery assembly of vehicle 10 (vehicle of interest), battery pack manufacturer 34 manufactures a battery assembly to be mounted on vehicle 10 with a cell and a spacer based on the assembly information.

FIG. 22 is a flowchart illustrating a procedure of processing performed by the ECU of vehicle 10. Processing shown in this flowchart is repeatedly performed by being called from a main routine every prescribed time or when a prescribed condition is satisfied. In steps S210 to S230, the battery assembly, the ECU, the storage, and the communication device of vehicle 10 are in conformity with battery assembly 100, ECU 15, storage 16, and communication device 17 shown in FIG. 4, respectively, and basic functions thereof have already been described in the embodiment and hence description thereof will not be provided.

Referring to FIG. 22, the ECU obtains information on a use history of a battery assembly of vehicle 10 (step S210). The use history information includes an environment of use of the battery assembly mounted on vehicle 10, a condition for traveling of vehicle 10, a time period of traveling of vehicle 10, and a frequency of traveling of vehicle 10.

The environment of use of the battery assembly is a parameter representing an environment at the time when the battery assembly is used, and includes, for example, a temperature and a humidity at which the battery assembly is used. The environment of use of the battery assembly tends to greatly vary depending on an area where the battery assembly is used. The condition for traveling of vehicle 10 is a parameter representing under which condition vehicle 10 travels, and includes, for example, a load in traveling and an SOC during traveling. As a load in traveling is higher, a load imposed on a battery is also higher. The time period of traveling of vehicle 10 is a parameter which becomes higher as a time period of traveling under a prescribed condition of vehicle 10 is longer. The condition can arbitrarily be set. The time period of traveling may be calculated with "no" condition being set and with every traveling being taken into consideration, or a time period of traveling may be calculated with only traveling under a specific condition being taken into consideration. The frequency of traveling of vehicle 10 is a parameter which becomes higher as the number of times of traveling during a prescribed period is greater. The period can arbitrarily be set. The number of times of traveling may be calculated with the period being set to the "whole period" and with all periods being taken into consideration, or with only traveling during a most recent period (a period from the current time point back to a time point a predetermined period before the current time point) being taken into consideration.

Information on a use history of a battery assembly may be expressed by a representative value (an average value, a mode value, or a median value) of a plurality of pieces of data resulting from detection by a sensor or an integrated value of data of interest. For example, the environment of use of the battery assembly may be represented by an average value of temperatures of use during a most recent period. The condition for traveling of vehicle 10 may be expressed by an average value of loads in traveling (for example, an average value per one trip, an average value per unit time period of traveling, or an average value per unit travel distance) or by a maximum value of a load in traveling. The time period of traveling of vehicle 10 may be expressed by an average time period of traveling per unit period (for example, one day) or an average time period of traveling per one trip. Alternatively, the time period of traveling of vehicle 10 may be expressed by an integrated value of time periods of traveling at a low SOC (for example, an SOC not higher than a prescribed value). A frequency of traveling of vehicle 10 may be expressed by an average number of times of traveling per unit period (for example, one day).

The ECU has the storage accumulate the information on the use history of the battery assembly as above (step S220). Then, the ECU reads the information on the use history of the battery assembly accumulated in the storage from the storage and transmits the use history information to management server 20A through the communication device (step S230).

Figure 23:
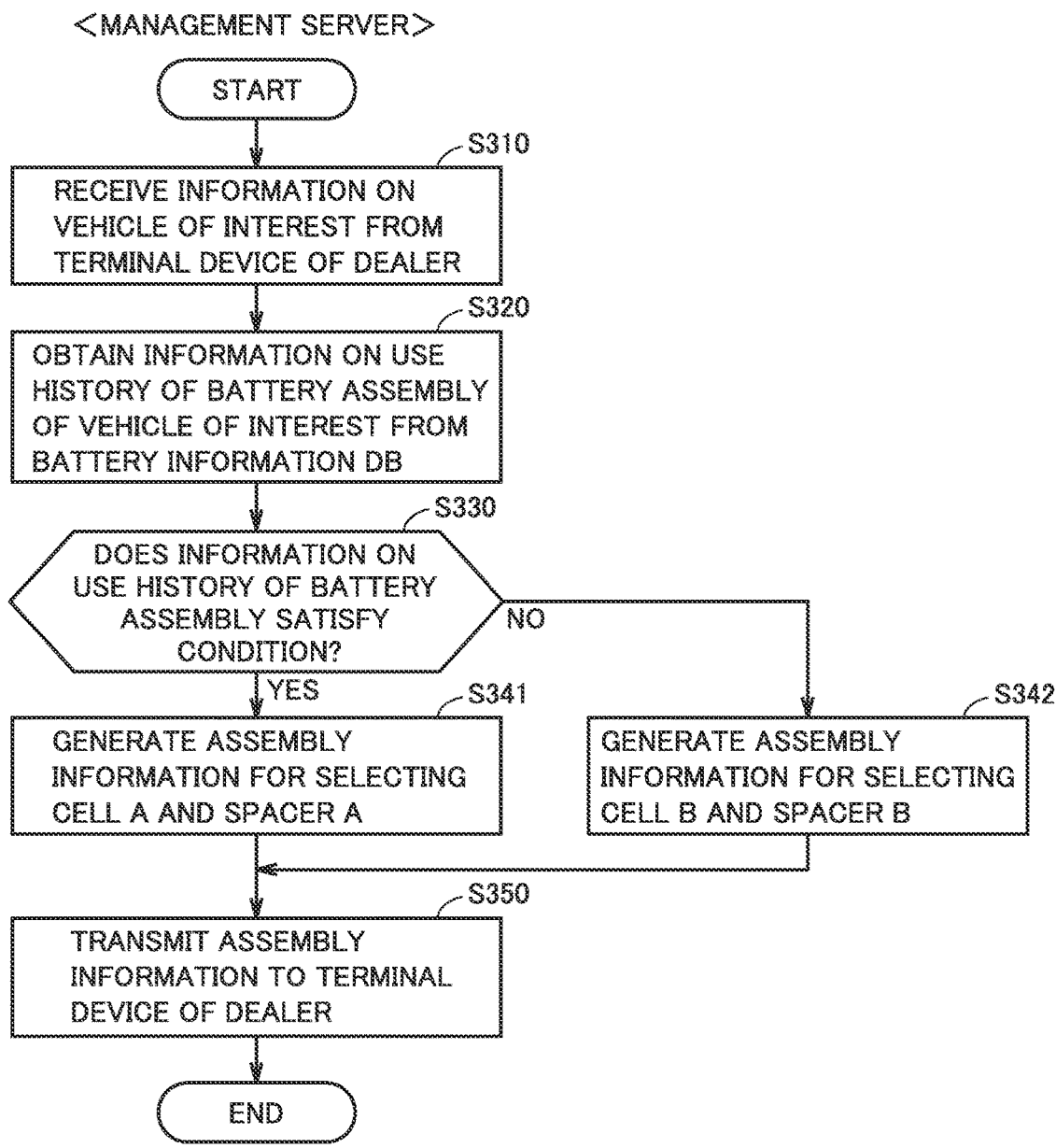
FIG. 23 is a flowchart illustrating a procedure of processing performed by a management server in the battery manufacturing system according to the second embodiment.

FIG. 23 is a flowchart illustrating a procedure of processing performed by management server 20A. Processing shown in the flowchart is performed when information for identifying vehicle 10 (vehicle of interest) of which battery assembly is to be replaced is received from terminal device 45 of dealer 35. For example, when a user who is considering purchase of a new car brings currently used vehicle 10 (vehicle of interest) to dealer 35, information for identifying vehicle 10 is transmitted from terminal device 45 of dealer 35 to management server 20A.

Referring to FIG. 23, management server 20A (information processing apparatus 21A) receives the information on the vehicle of interest (vehicle 10) from terminal device 45 of dealer 35 (step S310). Then, management server 20A obtains information on a use history of a battery assembly of the vehicle of interest (vehicle 10) from battery information DB 24A (step S320). Management server 20A obtains the information on the use history of the battery assembly of the vehicle of interest (vehicle 10) identified by the information received from terminal device 45 of dealer 35 from battery information DB 24A. The information on the use history of the battery assembly includes, for example, an environment of use of the battery assembly mounted on vehicle 10, a condition for traveling of vehicle 10, a time period of traveling of vehicle 10, and a frequency of traveling of vehicle 10. Specifically, in step S320, the information on the use history of the battery assembly necessary for determining whether or not a condition is satisfied in next step S330 is obtained from battery information DB 24A.

Then, management server 20A determines whether or not the information on the use history of the battery assembly of vehicle 10 obtained from battery information DB 24A satisfies a prescribed condition (step S330). A condition that high-rate deterioration of a cell is less likely to occur and/or a condition that deterioration of a material for the cell is likely to occur are/is adopted as the prescribed condition. For example, at least one of conditions A to F below can be adopted. An arbitrary value can be set independently for each prescribed value in conditions A to F below.

(Condition A) An average temperature of use during a most recent period is higher than a prescribed value.

(Condition B) An average load in traveling per one trip is lower than a prescribed value.

(Condition C) An average time period of traveling per one day is shorter than a prescribed value.

(Condition D) An average number of times of traveling per one day is smaller than a prescribed value.

(Condition E) An integrated value of time periods of traveling at a low SOC is smaller than a prescribed value.

(Condition F) An average temperature of use during a most recent period is higher than a prescribed value and a maximum value of a load in traveling during that period is smaller than a prescribed value.

When it is determined in step S330 that the information on the use history of the battery assembly satisfies the condition above (YES in step S330), management server 20A generates assembly information (first assembly information) for rebuilding with cell A and spacer A (FIGS. 13 and 14) (step S341). For example, with the condition A being adopted as the condition, when the average temperature of use during the most recent period is higher than the prescribed value, it is determined in step S330 that the condition is satisfied.

When it is determined in step S330 that the information on the use history of the battery assembly does not satisfy the condition (NO in step S330), management server 20A generates assembly information (second assembly information) for rebuilding with cell B and spacer B (FIGS. 13 and 14) (step S342). For example, with the condition A being adopted as the condition, when an average temperature of use during the most recent period is not higher than the prescribed value, it is determined in step S330 that the condition is not satisfied.

After management server 20A performs any of steps S341 and S342 in conformity with steps S151 and S152 in FIG. 10 and generates assembly information, it transmits the generated assembly information to terminal device 45 of dealer 35 to which vehicle 10 has been brought (step S350).

Dealer 35 can propose replacement of a battery assembly of vehicle 10 (vehicle of interest) or replacement of the entire vehicle 10 (offering of a new car) to a user by referring to the assembly information. As dealer 35 asks battery pack manufacturer 34 to manufacture a battery assembly, battery pack manufacturer 34 manufactures a battery assembly. When a user desires a new car, battery pack manufacturer 34 manufactures a battery assembly to be mounted on a new car with a cell and a spacer based on the assembly information. When the user desires replacement of a battery assembly of vehicle 10, battery pack manufacturer 34 manufactures a battery assembly to be mounted on vehicle 10 with a cell and a spacer based on the assembly information.

A battery assembly is manufactured at any timing without being limited to the timing when a user is considering purchase of a new car, and a battery assembly may be manufactured, for example, at the timing when the user is considering repair of vehicle 10 (vehicle of interest).

As set forth above, in battery management system 1A according to the second embodiment, management server 20A (assembly information generator) determines whether or not information on a use history of a battery assembly satisfies a prescribed condition (step S330) and generates assembly information (any one of first assembly information and second assembly information) for selecting a cell and a spacer to be used for manufacturing a battery assembly. Specifically, when the condition is satisfied, in step S341, assembly information (first assembly information) indicating selection of a cell highly resistant against material deterioration and a spacer highly resistant against material deterioration (cell A and spacer A) is generated. When the condition is not satisfied, in step S342, assembly information (second assembly information) indicating selection of a cell highly resistant against high-rate deterioration and a spacer highly resistant against high-rate deterioration (cell B and spacer B) is generated. Battery pack manufacturer 34 newly manufactures a battery assembly in accordance with the assembly information.

By manufacturing a battery assembly as above, a battery assembly can newly be manufactured with a cell and a spacer suited to usage of vehicle 10 by a user.

Battery management system 1A according to the second embodiment determines whether or not the condition is satisfied based on at least one of an environment of use of a battery assembly, a condition for traveling of the vehicle, a time period of traveling of the vehicle, and a frequency of traveling of the vehicle (see the conditions A to F). Based on the environment of use of the battery assembly, the condition for traveling of the vehicle, the time period of traveling of the vehicle, and the frequency of traveling of the vehicle, which deterioration mode of deterioration of a material and high-rate deterioration is more dominant in connection with usage of a vehicle of interest can be determined. For example, when a temperature at which the battery assembly is used is high, when a load in traveling of the vehicle is low, when a time period of traveling per one day is short, or when a frequency of traveling is low, deterioration of a material tends to proceed more than high-rate deterioration. When the time period of traveling at a low SOC is long, high-rate deterioration tends to proceed more than deterioration of a material. By manufacturing a battery assembly with a cell and/or a spacer highly resistant against a dominant deterioration mode, a battery assembly suited to usage by a user is obtained.

The conditions A to E each adopt at least one of a condition that a temperature of use (one of environments of use) is higher than a prescribed value, a condition that a load in traveling (one of conditions for traveling) is lower than a prescribed value, a condition that a time period of traveling per one day is shorter than a prescribed value, and a condition that a frequency of traveling is lower than a prescribed value as a necessary condition (more specifically, a necessary and sufficient condition). For example, the condition A adopts a condition that a temperature of use is higher than a prescribed value as a necessary and sufficient condition. The condition F adopts a condition that a temperature of use is higher than a prescribed value and a condition that a load in traveling is lower than a prescribed value as necessary conditions, and adopts a condition that a temperature of use is higher than a prescribed value and a load in traveling is lower than a prescribed value as a sufficient condition.

The condition to be subjected to determination in step S330 is not limited to the conditions A to F, and any condition can be adopted so long as a condition that high-rate deterioration of a cell is less likely to occur and/or a condition that deterioration of a material for a cell is likely to occur are/is adopted. Alternatively, a plurality of conditions may be prepared for allowing selection from among them and one of the plurality of conditions may be selected depending on a type of vehicle 10 (vehicle of interest).

Though management servers 20 and 20A generate assembly information for manufacturing a battery assembly in the first and second embodiments, a terminal device different from management servers 20 and 20A (which is referred to as "another terminal device" below) may generate assembly information. For example, another terminal device may obtain ratio Dm/Dh calculated by management servers 20 or 20A from management servers 20 or 20A and generate assembly information. Another terminal device may be any of terminal devices 41 to 45 shown in FIG. 3 or may separately be provided.

Though embodiments of the present disclosure have been described, it should be understood that the embodiments disclosed herein are illustrative and non-restrictive in even respect. The scope of the present disclosure is defined by the terms of the claims and is intended to include any modifications within the scope and meaning equivalent to the terms of the claims.

What is claimed is:

1. A battery information processing apparatus which processes information for manufacturing a battery assembly constructed by alternately stacking a plurality of cells and a plurality of spacers, the battery information processing apparatus comprising:
   a battery information obtaining device configured to obtain information on a use history of the battery assembly used in a vehicle; and
   an assembly information generator configured to generate assembly information for selecting a cell and a spacer to be used for manufacturing the battery assembly,
   the assembly information generator being configured to generate any one of first assembly information and second assembly information by using the information on the use history,
   the first assembly information indicating selection of a cell and a spacer determined as being higher in resistance against deterioration of a material for the cell than resistance against high-rate deterioration of the cell based on a prescribed indicator, and
   the second assembly information indicating selection of a cell and a spacer determined as being higher in resistance against high-rate deterioration of the cell than resistance against deterioration of the material for the cell based on the indicator.

2. The battery information processing apparatus according to claim 1, the battery information processing apparatus further comprising:
   a material deterioration amount calculator configured to calculate an amount of material deterioration by using the information on the use history; and
   a high-rate deterioration amount calculator configured to calculate an amount of high-rate deterioration by using the information on the use history, wherein
   the amount of material deterioration is an amount of increase in resistance of the cell due to deterioration of the material for the cell under influence by heat,
   the amount of high-rate deterioration is an amount of increase in resistance of the cell due to high-rate deterioration of the cell, and
   when a ratio of the amount of material deterioration to the amount of high-rate deterioration is higher than a threshold value, the assembly information generator is configured to generate the first assembly information, and when the ratio is lower than the threshold value, the assembly information generator is configured to generate the second assembly information.

3. The battery information processing apparatus according to claim 1, wherein
   the information on the use history includes at least one of an environment of use of the battery assembly, a condition for traveling of the vehicle, a time period of traveling of the vehicle, and a frequency of traveling of the vehicle, and
   when the information on the use history satisfies a prescribed condition, the assembly information generator is configured to generate the first assembly information, and when the information on the use history does not satisfy the prescribed condition, the assembly information generator is configured to generate the second assembly information.

4. The battery information processing apparatus according to claim 3, wherein
   at least one of a condition that a temperature of use representing the environment of use is higher than a prescribed value, a condition that a load in traveling representing the condition for traveling is lower than a prescribed value, a condition that a time period of traveling per one day representing the time period of traveling is shorter than a prescribed value, and a condition that a frequency representing the frequency of traveling is lower than a prescribed value is defined as the prescribed condition that is necessary.

5. The battery information processing apparatus according to claim 1, wherein
   the indicator includes a weight per unit area of a negative electrode of the cell and a BET specific surface area of the negative electrode of the cell, and
   a cell of which weight per unit area of the negative electrode is smaller than a prescribed value and of which BET specific surface area of the negative electrode is smaller than a prescribed value is determined as being higher in resistance against deterioration of the material than resistance against the high-rate deterioration.

6. The battery information processing apparatus according to claim 1, wherein
   the spacer used for manufacturing the battery assembly includes a plate-shaped main body and a protrusion which protrudes from the main body toward the cell, the indicator includes an area of contact between the protrusion and the cell, and
a spacer of which area of contact is greater than a prescribed value is determined as being higher in resistance against deterioration of the material than resistance against the high-rate deterioration.

7. A battery manufacturing support apparatus for manufacturing a battery assembly by replacing a cell and a spacer which constitute the battery assembly, the battery manufacturing support apparatus comprising:
an obtaining device configured to obtain assembly information generated by the battery information processing apparatus according to claim 1; and
a selector configured to select a cell and a spacer to be used for manufacturing the battery assembly in accordance with the assembly information obtained by the obtaining device.

8. A battery assembly manufactured in accordance with assembly information generated by the battery information processing apparatus according to claim 1.

9. A battery information processing method of processing information for manufacturing a battery assembly constructed by alternately stacking a plurality of cells and a plurality of spacers, the battery information processing method comprising:
obtaining information on a use history of the battery assembly used in a vehicle; and
generating assembly information, by a server, for selecting a cell and a spacer to be used for manufacturing the battery assembly,
the generating assembly information including generating any one of first assembly information and second assembly information by using the information on the use history,
the first assembly information indicating selection of a cell and a spacer determined as being higher in resistance against deterioration of a material for the cell than resistance against high-rate deterioration of the cell based on a prescribed indicator, and
the second assembly information indicating selection of a cell and a spacer determined as being higher in resistance against high-rate deterioration of the cell than resistance against deterioration of the material for the cell based on the indicator.

10. A method of manufacturing a battery assembly constructed by alternately stacking a plurality of cells and a plurality of spacers, the method comprising:
obtaining assembly information for selecting a cell and a spacer to be used for manufacturing the battery assembly; and
manufacturing the battery assembly by using the cell and the spacer selected in accordance with the obtained assembly information,
the assembly information being any one of first assembly information and second assembly information generated by using information on a use history of the battery assembly used in a vehicle,
the first assembly information indicating selection of a cell and a spacer determined as being higher in resistance against deterioration of a material for the cell than resistance against high-rate deterioration of the cell based on a prescribed indicator, and
the second assembly information indicating selection of a cell and a spacer determined as being higher in resistance against high-rate deterioration of the cell than resistance against deterioration of the material for the cell based on the indicator.

11. The method of manufacturing a battery assembly according to claim 10, wherein the assembly information is obtained by a server.

* * * * *

UNITED STATES PATENT AND TRADEMARK OFFICE
CERTIFICATE OF CORRECTION

PATENT NO. : 10,921,382 B2  
APPLICATION NO. : 16/225940  
DATED : February 16, 2021  
INVENTOR(S) : Keita Komiyama Page 1 of 1

It is certified that error appears in the above-identified patent and that said Letters Patent is hereby corrected as shown below:

In the Specification

In Column 2, Line(s) 6, after "fails", delete "in" and insert --to--, therefor.

In Column 7, Line(s) 14, after "correspondence", delete "it" and insert --information--, therefor.

In Column 7, Line(s) 19, after "spacers", insert --A--, therefor.

In Column 7, Line(s) 37, after "and", delete "B" and insert --B)--, therefor.

In Column 7, Line(s) 62, delete "FIG." and insert --Fig.1--, therefor.

In Column 10, Line(s) 36, before "to", delete "Retelling" and insert --Referring--, therefor.

In Column 13, Line(s) 11, after "carry", delete "but" and insert --out--, therefor.

In Column 13, Line(s) 46, before "may", delete "to" and insert --to Dh--, therefor.

In Column 13, Line(s) 60, after "collected", delete "b" and insert --by--, therefor.

In Column 14, Line(s) 59, after "another", delete "for" and insert --(for--, therefor.

In Column 14, Line(s) 67, before "SOC", delete "art" and insert --an--, therefor.

In Column 18, Line(s) 64, after "in", delete "jail" and insert --ion--, therefor.

In Column 21, Line(s) 48, after "plate", delete "H 2" and insert --112--, therefor.

In Column 25, Line(s) 60, after "at", delete "an" and insert --any--, therefor.

Signed and Sealed this  
Thirteenth Day of April, 2021

Drew Hirshfeld  
*Performing the Functions and Duties of the*  
*Under Secretary of Commerce for Intellectual Property and*  
*Director of the United States Patent and Trademark Office*